US008779030B2

(12) United States Patent
Perry et al.

(10) Patent No.: US 8,779,030 B2
(45) Date of Patent: Jul. 15, 2014

(54) METHOD FOR PATTERNING METAL USING NANOPARTICLE CONTAINING PRECURSORS

(75) Inventors: Joseph W. Perry, Tucson, AZ (US); Seth R. Marder, Tucson, AZ (US); Francesco Stellacci, Cambridge, MA (US)

(73) Assignee: The Arizona Board of Regents, The University of Arizona, Tucson, AZ (US)

( * ) Notice: Subject to any disclaimer, the term of this patent is extended or adjusted under 35 U.S.C. 154(b) by 589 days.

(21) Appl. No.: 11/736,695

(22) Filed: Apr. 18, 2007

(65) Prior Publication Data

US 2007/0190326 A1     Aug. 16, 2007

Related U.S. Application Data

(63) Continuation of application No. 10/450,661, filed as application No. PCT/US01/47724 on Dec. 17, 2001, now Pat. No. 7,252,699.

(60) Provisional application No. 60/256,148, filed on Dec. 15, 2000.

(51) Int. Cl.
*B22F 1/00*     (2006.01)

(52) U.S. Cl.
USPC ............... 523/201; 75/201; 148/513; 264/8; 264/10; 427/561; 430/269

(58) Field of Classification Search
USPC ............. 75/345; 148/413; 430/269; 523/201; 264/8, 10; 427/561
See application file for complete search history.

(56) References Cited

U.S. PATENT DOCUMENTS

| | | | |
|---|---|---|---|
| 3,956,395 A * | 5/1976 | Meyer | 568/34 |
| 4,367,131 A * | 1/1983 | Gratzel et al. | 204/157.52 |
| 4,943,316 A | 7/1990 | Taylor | |
| 5,045,364 A * | 9/1991 | Fang | 428/411.1 |
| 5,057,206 A | 10/1991 | Engel et al. | |
| 5,224,185 A * | 6/1993 | Ito et al. | 385/40 |
| 5,328,811 A | 7/1994 | Brestel | |
| 5,376,486 A * | 12/1994 | Itoh et al. | 430/59.2 |
| 5,503,877 A | 4/1996 | Stamp et al. | |
| 5,716,679 A | 2/1998 | Krug et al. | |
| 5,770,126 A | 6/1998 | Singh et al. | |
| 5,804,101 A * | 9/1998 | Cheng et al. | 252/582 |
| 5,910,390 A | 6/1999 | Hatanaka et al. | |
| 5,955,192 A | 9/1999 | Fukushima et al. | |
| 6,017,613 A | 1/2000 | Baum et al. | |
| 6,022,596 A | 2/2000 | Baum et al. | |
| 6,084,176 A | 7/2000 | Shiratsuchi et al. | |
| 6,235,540 B1 | 5/2001 | Siiman et al. | |
| 6,271,130 B1 * | 8/2001 | Rajh et al. | 438/677 |
| 6,319,426 B1 * | 11/2001 | Bawendi et al. | 252/301.4 R |
| 6,548,168 B1 * | 4/2003 | Mulvaney et al. | 428/402 |
| 6,596,194 B1 * | 7/2003 | Dobson et al. | 252/301.4 R |
| 6,882,051 B2 | 4/2005 | Majumdar et al. | |
| 6,890,624 B1 | 5/2005 | Kambe et al. | |
| 2001/0045547 A1 | 11/2001 | Senecal et al. | |
| 2003/0146019 A1 | 8/2003 | Hirai | |
| 2008/0176357 A1 | 7/2008 | Huet et al. | |
| 2010/0178665 A1 * | 7/2010 | Ignatius et al. | 435/29 |

FOREIGN PATENT DOCUMENTS

| | | |
|---|---|---|
| EP | 1 209 695 | 5/2002 |
| JP | 61-222195 | 10/1986 |
| JP | 62-296493 | 12/1987 |
| JP | 2-153991 | 6/1990 |
| JP | 5-501572 | 3/1993 |
| JP | 5-501928 | 4/1993 |
| JP | 5-279862 | 10/1993 |
| JP | 6-136547 | 5/1994 |
| JP | 6-235069 | 8/1994 |
| JP | 7-58440 | 3/1995 |
| JP | 7-113178 | 5/1995 |
| JP | 7-129104 | 5/1995 |
| JP | 7-336018 | 12/1995 |
| JP | 8-318690 | 12/1996 |
| JP | 9-244253 | 9/1997 |
| JP | 9-260808 | 10/1997 |
| JP | 9-282709 | 10/1997 |
| JP | 10-209585 | 8/1998 |
| JP | 11-140436 | 5/1999 |
| JP | 2000-347398 | 12/2000 |
| JP | 2001-1662 | 1/2001 |
| JP | 4814307 B2 | 11/2011 |
| WO | WO 91/06036 | 5/1991 |
| WO | WO 98/57735 | 12/1998 |
| WO | WO 99/19730 | 4/1999 |
| WO | WO 99/21934 | 5/1999 |
| WO | WO 99/41613 | 8/1999 |
| WO | WO 01/88540 | 11/2001 |
| WO | WO 01/90226 | 11/2001 |

OTHER PUBLICATIONS

Van et al. "Effect of Plasticizer and Temperature of the photorefractive phase shift." Journal of Material Chemistry, pp. 2692-1697, 2000.*
Oster et al. "Photoreduction of Metal Ions by Visible Light." Contribution from the Department of Chemistry, Polytechnic Institute of Brooklyn, pp. 5543-554, Nov. 5, 1995.*
Musick, Michael D., et al., "Metal Films Prepared by Stepwise Assembly. 2. Construction and Characterization of Colloidal Au and Ag Multilayers", Chem. Mater., vol. 12, No. 10, pp. 2869-2881, published Sep. 9, 2000.
Decision of Rejection issued May 10, 2011, in Japan Patent Application No. 2007-270125 (English translation only).
Office Action issued Dec. 26, 2012 in Japanese Application No. 2007-270124 (English Translation).
Communication issued Jun. 26, 2012 in European Patent Application No. 01 987 356.1-2102.
European Office Action issued Jul. 25, 2013 in Patent Application No. 01 987 356.1
Office Action issued Nov. 1, 2011 in Japanese Application No. 2007-270124 (w/English translation).

* cited by examiner

*Primary Examiner* — Hannah Pak
(74) *Attorney, Agent, or Firm* — Oblon, Spivak, McClelland, Maier & Neustadt, L.L.P.

(57) ABSTRACT

Continuous, conducting metal patterns can be formed from metal nanoparticle containing films by exposure to radiation (FIG. 1). The metal patterns can be one, two, or three dimensional and have high resolution resulting in feature sizes in the order of micron down to nanometers Compositions containing the nanoparticles coated with a ligand and further including a dye, a metal salt, and either a matrix or an optional sacrificial donor are also disclosed.

34 Claims, 24 Drawing Sheets

METHOD FOR PATTERNING METAL USING NANOPARTICLE CONTAINING PRECURSORS

CROSS REFERENCE TO RELATED APPLICATIONS

This application is a continuation of U.S. application Ser. No. 10/450,661 filed on Dec. 15, 2003, now U.S. Pat. No. 7,252,699 which is a National Stage of PCT/US01/47724 filed on Dec. 17, 2001, all of which claim priority to Non-Provisional U.S. Application Ser. No. 60/256,148 filed on Dec. 15, 2000. The contents of each of these documents are incorporated herein by reference.

BACKGROUND OF THE INVENTION

1. Field of the Invention

The present invention relates to the patterning of a metal feature using a metal nanoparticles containing material and exposing it to radiation.

2. Discussion of the Background

Currently available technology for the micro fabrication of metal patterns includes:

1) use of masks to define patterns of metal by deposition or etching (Shacham-Diamand, Y., Inberg, A, Sverdlov, Y. & Croitoru, N., Electroless silver and silver with tungsten thin films for microelectronics and microelectromechanical system applications. *Journal of the Electrochemical Society,* 147, 3345-3349 (2000));

2) laser ablation of metal films to create patterns;

3) laser direct writing based on pyrollitic deposition of metal from vapor, solution or solid precursors; (Auerbach, A., On Depositing Conductors From Solution With a Laser, *Journal of the Electrochemical Society,* 132, 130-132 (1985); Auerbach, A., Optical-Recording By Reducing a Metal Salt Complexed to a Polymer Host, *Applied Physics Letters,* 45, 939, 941 (1984); Auerbach, A, Copper Conductors By Reduction of Copper (I) Complex in a Host Polymer, *Applied Physics Letters,* 47, 669-671 (1985); Auerbach, A., Method For Reducing Metal-Salts Complexed in a Polymer Host With a Laser, *Journal of the Electrochemical Society,* 132, 1437-1440 (1985)); and 4) light exposure and development of silver-halide based photographic film followed by electroless and electrochemical plating (Madou, M. & Florkey, J., From batch to continuous manufacturing of microbiomedical devices. *Chemical Reviews,* 100, 2679-2691 (2000); M. Madou, *Fundamentals of Microfabrication* (CRC Press, Boca Raton, 1997); Madou, M., Otagawa, T., Tierney, M. J., Joseph, J. & Oh, S. J., Multilayer Ionic Devices Fabricated By Thin-Film and Thick-Film Technologies. *Solid State Ionics,* 53-6, 47-57 (1992)).

Currently available methods are described, for example, in the following publications:

Southward, R. E. et al., Synthesis of surface-metallized polymeric films by in situ reduction of (4,4,4-trifluoro-1-(2-thienyl)-1,3-butanedionato) silver(I) in a polyimide matrix. *Journal of Materials Research,* 14, 2897-2904 (1999);

Southward, R. E. & Thompson, D. W. Inverse CVD, A novel synthetic approach to metallized polymeric films. *Advanced Materials,* 11, 1043-1047 (1999);

Gu, S., Atanasova, P., Hampden-Smith, M. J. & Kodas, T. T., Chemical vapor deposition of copper-cobalt binary films. *Thin Solid Films,* 340, 45-52 (1999);

Jain, S., Gu, S., Hampden-Smith, M. & Kodas, T. T., Synthesis of composite films. *Chemical Vapor Deposition,* 4, 253-257 (1998);

Gu, S., Yao, X. B., Hampden-Smith, M. J. & Kodas, T. T., Reactions of Cu(hfac)(2) and Co-2(CO)(8) during chemical vapor deposition of copper-cobalt films. *Chemistry of Materials,* 10, 2145-2151 (1998);

Calvert, P. & Rieke, P., Biomimetic mineralization in and on polymers. *Chemistry of Materials,* 8, 1715-1727 (1996);

Hampden-Smith, M. J. & Kodas, T. T., Chemical-Vapor-Deposition of Metals. 2. Overview of Selective CVD of Metals. *Chemical Vapor Deposition,* 1, 39-48 (1995);

Hampden-Smith, M. J. & Kodas, T. T., Chemical-Vapor-Deposition of Metals. 1. an Overview of CVD Processes. *Chemical Vapor Deposition,* 1, 8-23 (1995);

Xu, C. Y., Hampden-Smith, M. J. & Kodas, T. T., Aerosol-Assisted Chemical-Vapor-Deposition (AACVD) of Binary Alloy (Ag(x)Pd(l)—X, Cu(X)Pd(l)—X, Ag(x) Cu(l)X) Films and Studies of Their Compositional Variation. *Chemistry of Materials,* 7, 1539-1546 (1995); and Naik, M. B., Gill, W. N., Wentorf, R. H. & Reeves, R. R., CVD of Copper Using Copper(I) and Copper(II) Beta-Diketonates. *Thin Solid Films,* 262, 60-66 (1995).

The above described methods are limited to direct production of two-dimensional patterns, and three-dimensional patterns must be built up by use of multilayer or multistep processes. Laser direct writing of metal lines allows for single step microfabrication of one-dimensional or two-dimensional patterns, but has mainly involved thermal decomposition of a metal precursor at a high temperature created by absorption of laser energy. There is great interest in an ambient temperature process for forming metal lines by laser writing and for directly writing three-dimensional metal patterns.

Swainson et al., in a series of patents, (U.S. Pat. Nos. 4,466,080; 4,333,165; 4,238,840; and 4,288,861) described the photoreduction of silver by using conventional dyes such as methylene-blue and others as silver photoreducing agents in solution. Silver coatings of surfaces following optical excitation of such silver ion and dye solutions were described. The presence of "certain reducing/chelating agents, such as o-phenanthroline" were described as being a fundamental component of the system. Swainson also described that by following similar methods one would not be able to write continuous metal phases within a solid matrix. In fact, the introduction to the sections that included the metal photoreduction stated that the previously generally preferred stabilized or solid media are not suitable for the production of products with a material complexity above a certain level. Accordingly, their examples used gaseous and liquid physical states which according to Swainson permit increased complexity of products by virtue of their transportive capability. In the solid state, the present inventors have indeed found that Swainson's method does not result in the formation of continuous metal.

Whitesides et al. described a multistep method for the generation of conductive metal features both in an article: Deng T., Arias, F., Ismagilov, R. F., Kenis, P. J. A. & Whitesides, G. M., Fabrication of metallic microstructures using exposed, developed silver halide-based photographic film. *Analytical Chemistry,* 72, 645-651 (2000); and in U.S. Pat. No. 5,951,881. The key difference between the system described by Whitesides et al. and the system of the present invention is that they photochemically generate metal nanoparticles in a gelatin and in a subsequent step they use an electroless deposition of silver on the silver crystals, so as to develop it (Braun, E., Eichen, Y., Sivan, U. & Ben-Yoseph, G., DNA-templated assembly and electrode attachment of a conducting silver wire. *Nature,* 391, 775-778 (1998)), thus forming a continuous metal structure. Moreover, in order to obtain real 3D patterns they have to perform multi-step construction of the device. The smallest dimension of the lines (30 µm) described by Whitesides et al. is much larger than the one achievable with the method according to the present invention.

Reetz et al. described in an article and a patent titled: "Lithographic process using soluble or stabilized metal or bimetal clusters for production of nanostructures on surfaces" the fabrication via electron beam irradiation of continuous metal features starting from surfactant stabilized metal nanoparticles (Reetz, M. T., Winter, M., Dumpich, G., Lohau, J. & Friedrichowski, S. Fabrication of metallic and bimetallic nanostructures by electron beam induced metallization of surfactant stabilized Pd and Pd/Pt clusters. Journal of the American Chemical Society 119, 4539-4540 (1997); Dumpich, G., Lohau, J., Wassermann, E. F., Winter, M. & Reetz, M. T. in Trends and New Applications of Thin Films 413-415 (Transtec Publications Ltd, Zurich-Uetikon, 1998). Bedson et al., describe the electron beam writing of metal nanostructures starting from passivated gold clusters, that were alkylthiol capped gold nanoparticles. Bedson T. R., Nellist P. D., Palmer R. E., Wilcoxon J. P. Direct Electron Beam Writing of Nanostructures Using Passivated Gold Clusters. Microelectronic Engineering 53, 187-190 (2000)).

The differences between what is described there and the present invention are:

1) Reetz et al's and Bedson et al's processes involve fusion of nanoparticles rather than the growth of nanoparticles based on the generation of metal atoms upon excitation;

2) their starting materials are made solely of stabilized nanoparticles, whereas we teach the use of composite materials in which stabilized nanoparticles are just one of the components;

3) their irradiation method is solely electron-beam irradiation, while we teach that using suitable reducing agents our composite materials can be good precursors for a wide variety of stimulating radiation, electron-beams being just one of them; and 4) their nanoparticles are coated with ligands that provide only stabilization solubilization properties, while our compositions for electron beam patterning of metal are composites based on nanoparticles, metal salt, and an excited dye reducing agent, that can be included by covalent attachment to a ligand on the nanoparticle.

The compositions and methods of excitation of dyes with strong multiphoton absorption properties have been disclosed by Marder and Perry, U.S. Pat. No. 6,267,913 "Two-Photon or Higher-Order Absorbing Optical Materials and Methods of Use".

Some compositions and methods have been disclosed for the multiphoton generation of reactive species including the photogeneration of silver particles in a patent application by B. H. Cumpston, M. Lipson, S. R. Marder, J. W. Perry "Two-Photon or higher order absorbing optical materials for generation of reactive species" U.S. patent application No. 60/082,128. The method taught in U.S. patent application No. 60/082,128 differs from those of this invention because in the prior application there is no mention of the use of metallic nanoparticles as precursors.

SUMMARY OF THE INVENTION

It is an object of the present invention to provide a process for 1) direct fabrication of one, two or three-dimensional microstructures of metal in a single processing step, and 2) the fabrication of nanometer scale metal patterns in one or two dimensional patterns also in a single processing step. Specifically, it is an object of the present invention to provide a low temperature process for forming metal lines by laser writing and for directly writing three-dimensional patterns.

These and other objects have been achieved by the present invention the first embodiment which includes a method for growth of a pre-nucleated metal nanoparticle, comprising:

providing said pre-nucleated metal nanoparticle in a composite;

generating a metal atom by reducing a metal ion by exposure to radiation;

reacting said metal atom with said pre-nucleated metal nanoparticle, thereby growing a metal nanoparticle.

Another embodiment of the invention includes a method for growth of a pre-nucleated metal nanoparticle, comprising:

forming a film from said pre-nucleated metal nanoparticle, a metal salt, a dye and a polymer matrix;

generating a metal atom by reducing a metal ion of said metal salt by exposure to radiation;

reacting said metal atom with said pre-nucleated metal nanoparticle, thereby growing a metal nanoparticle.

Yet another embodiment of the present invention includes a metal nanoparticle containing composition, comprising:

a ligand coated metal nanoparticle;
a dye;
a metal salt; and
optionally a sacrificial donor.

Another embodiment of the present invention includes a metal nanoparticle containing composition, comprising:

a ligand coated metal nanoparticle;
a dye;
a metal salt; and
a matrix.

A further embodiment of the present invention includes a method, comprising:

subjecting one of the above metal nanoparticles containing compositions to radiation, thereby effecting a growth of said nanoparticles; and forming a continuous or semi-continuous metal phase.

The present invention further includes a method, comprising:

forming a film from a metal nanoparticle, a metal salt, a dye and a polymer matrix; and exposing said film to radiation, thereby producing a pattern of a conductive metal.

DETAILED DESCRIPTION OF THE INVENTION

Figure 1:
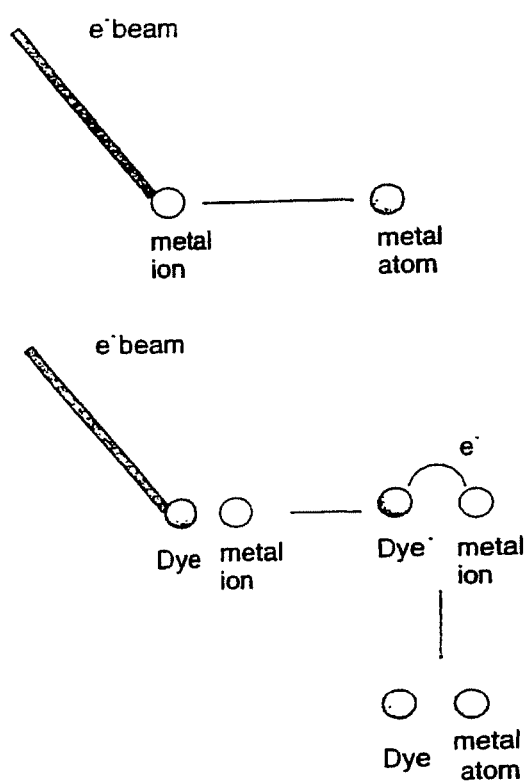
FIG. 1. Schematic illustration of case 1 growth process.

The present invention relates to the use of metal nanoparticle containing films in conjunction with exposure to radiation to activate the growth and fusion of such particles to form continuous conducting metal patterns. In the process, one, two, or three dimensional, continuous conducting metal wires or other patterns may be formed.

The novel metal nanoparticle systems and methods of exposure for the direct patterning of metal in three dimensions and with high resolution in the order of microns to nanometers, are unprecedented. Subjecting certain nanoparticle containing compositions to forms of excitation can result in growth of these particles, leading ultimately to a continuous (or semi-continuous) metal phase. Patterned excitation leads to formation of corresponding metallic patterns. Methods based on two types of compositions and involving free space optical exposure, near-field optical exposure or exposure with ionizing radiation, such as electrons from the conductive tip of an scanning probe microscope are described herein.

In the process of the present invention, radiation from different sources results in different resolution. For example, a feature sizes of down to 300 nm can be achieved using a blue laser and one photon excitation. A feature size of down to 100 nm, and preferably down to 50 nm may be achieved using a near field light source. If two photon excitation is used, the feature size may be down to 100 nm, preferably 50 nm. Electron-beams allow for a resolution of 10 nm to 300 nm. Focused ion beam allow for a feature size of down to 5 to 10 nm. An extremely small feature size of down to 5 nm may be achieved using a Scanning Probe Microscope tip.

The nanoparticles used in the method according to the present invention are mainly those coated with organic ligands. By ligand, we mean any molecule or ion that has at least one atom having a lone pair of electrons that can bond to a metal atom or ion. By ligand, we also mean unsaturated molecules or ions that can bond to a metal atom or ion. Unsaturated molecules or ions possess at least one π-bond, which is a bond formed by the side-by-side overlap of p-atomic orbitals on adjacent atoms. One example of an organic ligand for silver, gold, or copper nanoparticles is an n-alkylthiol ligand, which preferably has an alkyl chain length of 4 to 30 carbons. The coatings of the nanoparticles render them soluble in common organic solvents and processable by solution processing techniques. These coatings can also stabilize the nanoparticle with respect to aggregation and/or coalescence of the metal core of the particle. Throughout this disclosure, the term ligand coated nanoparticle is used to describe such stabilized particles. Furthermore, according to the present invention, nanoparticles with two or more different types of ligands, such as two alkylthiol ligands of different lengths exhibit increased solubility in organic solvents and polymer matrices, such as poly(vinyl carbazole) and a reduced tendency towards the formation of aggregates resulting from inter-digitation of ligands, compared to nanoparticles coated with one type of alkylthiol ligand, which are known to form aggregates with interdigitated ligands. Voicu, R., Badia, A., Morin, F., Lennox, R. B. & Ellis, T. H., Thermal behavior of a self-assembled silver n-dodecanethiolate layered material monitored by DSC, PTIR, and C-13 NMR spectroscopy. *Chemistry of Materials,* 12, 2646-2652 (2000); Sandhyarani, N., Pradeep, T., Chakrabarti, J., Yousuf, M. & Sahu, H. K. Distinct liquid phase in metal-cluster superlattice solids. *Physical Review B,* 62, 8739-8742 (2000); Sandhyarani, N. & Pradeep, T., Crystalline solids of alloy clusters. *Chemistry of Materials,* 12, 1755-1761 (2000); Badia, A. et al., Self-assembled monolayers on gold nanoparticles. *Chemistry-a European Journal,* 2, 359-363 (1996)). The use of nanoparticles with two or more types of ligands for the formation of a metal nanoparticle/polymer composite is advantageous because a higher concentration of particles may be achieved and the optical quality of the composite may be higher, since the reduction of aggregation leads to lower optical scattering compared to composites including nanoparticles with a single type of alkylthiol ligand. The ligand coated nanoparticles can be easily spin coated, casted or inserted as dopants into organic films or diffused into inorganic glasses prepared via sol-gel chemistry. Two classes of compositions are described here. They differ in the nature of the matrix:

Class I is a composition in which the ligand coated nanoparticles themselves are the matrix.

Class II is a composition in which a polymer, a glass or a highly viscous liquid is the matrix, and the nanoparticles are dopants.

It is known that photochemical reduction of metal ions, such as silver ions ($Ag^+$), by suitable dye molecules leads to the formation of $Ag^0$ atoms and the nucleation of small, nanometer-sized particles of $Ag^0$. However, a key problem with past attempts to photochemically write continuous, conducting metal patterns is that the limited supply of metal ions in the precursor material, as well as the high degree of excitation required to provide nucleation centers makes the growth of continuous metal quite difficult. Particles formed are typically not interconnected and do not form a conductive path. With this type of product one would have to perform an additional wet chemical processing step to "develop" the particles to form conductive lines. However, according to the present invention, incorporation of ligand-coated silver nanoparticles into the precursor material overcomes this problem by providing both initial nucleation sites for growth of the metal, and some starting volume fraction of metal. Upon sufficient growth, the surface coverage of the ligand on the nanoparticle becomes insufficient to prevent the particle from undergoing fusion with other neighboring growing particles to form a larger metal phase. The surface coverage of the ligand on the nanoparticle becomes insufficient to prevent the particle from undergoing fusion with other neighboring growing particles to form a larger metal phase. Thus, upon sufficient growth the nanoparticles become highly interconnected and form well conducting pathways. The approach disclosed here allows for direct and simple, photochemical fabrication of microstructures of conductive metal, at low temperatures, such as ambient room temperature (21° C.).

One type of composition that is effective in the method according to the present invention involves a composite containing a) metal nanoparticles, b) a metal salt and c) a dye, capable of excited state reduction of the metal ions and possessing appropriate light absorption properties, and d) a polymer host material. Many variations on the composition of this composite are possible, including: 1) the type of metal nanoparticle, 2) the type of metal ion, 3) the counterion of the metal salt, 4) the structure of the dye, 5) whether or not a polymer host is used, and 6) the type of polymer host if one is used. By the term dye, we mean a molecule or ion that absorbs photons with wavelengths ranging from 300 nm to 1.5 µm. Depending on the composition, metal nanoparticle/polymer nano-composites with good light transmission properties and large thickness, up to hundreds of micrometers, preferably up to 500 micrometers, more preferably up to 700 micrometers and most preferably up to 900 micrometers, can be prepared. In the method according to the present invention, such composite can be exposed in a patterned manner with optical radiation or with ionizing radiation beams, either by use of a mask or by suitable scanning of a highly confined beam of radiation, to produce a pattern of conductive metal.

According to the present invention, compositions incorporating dye molecules possessing two-photon absorption cross sections greater than or equal to $1 \times 10^{-50}$ cm$^4$ photon$^{-1}$ sec$^{-1}$ and capable of excited-state reduction of the metal ions can be used to create three dimensional patterns of conductive metal. Examples of dye molecules with large two-photon absorption cross sections are described in U.S. Pat. No. 6,267,913 which is included herein by reference. In the present embodiment, a tightly focused, high intensity laser beam tuned to the two-photon absorption band of the dye is used to localize the photoactivated growth of metal to a small volume. The ability to achieve high 3D spatial resolution arises from the fact that the probability of simultaneous absorption of two photons depends quadratically on the intensity of the incident laser light. If a tightly focused beam is used, the intensity is highest at the focus and decreases quadratically with the distance (z) from the focal plane, for distances larger than the Rayleigh length. Thus, the rate at which molecules are excited decreases very rapidly (as $z^{-4}$) with the distance from the focus and the excitation is confined in a small volume around the focus (of the order of $\lambda^3$, where $\lambda$ is the wavelength of the incident beam). The sample or the focused beam can be scanned and the intensity controlled to map out a three dimensional pattern of exposure and to produce 3D structures comprised of continuous metal.

In a preferred embodiment, Ag nanoparticles (with a ligand coating) are combined with AgBF$_4$ salt, and an electron deficient two-photon absorbing dye in polyvinylcarbazole, to form a composite. In an example of exposure with radiation for writing of a metal pattern, 100 fs laser pulses at a wavelength of 730 nm are focused onto the film resulting in the formation of reflective and conductive Ag metal at the points of exposure. Preferably, the laser wavelength ranges from 157 nm to 1.5 µm for one-photon excitation and from 300 nm to 3.0 µm for two-photon excitation. The pulse width of the laser is preferably in the order of $\leq 1$ µs to 10 fs for two-photon excitation. Arbitrary patterns of Ag metal can be written by moving the point of focus in the film. Writing of microscale lines, rectangular shapes and various 3D patterns of metal lines has been accomplished with this method. Many variations in the step of exposure with radiation are possible, as would be known to those skilled in the art of radiation induced change of materials properties. For example, electron beams, electrical current via a scanning probe tip, focused ion beams, γ-radiation, x-rays, UV-rays, VUV-rays, neutron beams, and neutral atom beams may be used in the method of the present invention.

Formation and Growth of Metal Nanoparticles

It is known that the formation of alkylthiolate coated metal nanoparticles proceeds via a nucleation-growth mechanism (Hostetler, M. J. et al., Alkanethiolate gold cluster molecules with core diameters from 1.5 to 5.2 nm: Core and monolayer properties as a function of core size. *Langmuir,* 14, 17-30 (1998)) that involves the formation of a layered stoichiometric compound as a first step as illustrated below for Ag:

$$nAg^+ + nRSH \rightarrow (AgSR)_n + H^+$$

followed by a second step involving growth. The second step can be due to the presence of silver zero atoms:

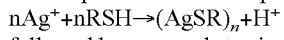

with n'=n+m
or to the presence of an agent that reduces the metal ions of the layered compound themselves:

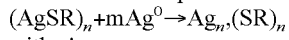

with 2m'=n−m

Once generated, these nanoparticles are soluble materials that are processable with standard methods. In particular, their solubility in organic solvents allows for a multiplicity of processing techniques based on which films of nanoparticles or solid matrices with incorporated nanoparticles can be created. We teach that, with such a nanoparticle film or composite, the growth of nanoparticles may be driven such that they increase in size, and contact and fuse with other nanoparticles. When this process occurs to a sufficient extent, then a continuous metallic feature (single or polycrystalline) will be formed.

One important contribution of the present invention is that it teaches the materials and exposure conditions that allow the growth of pre-nucleated metal nanoparticles in solid state. By the term pre-nucleated metal nanoparticle we mean a metal nanoparticle which has been nucleated and grown in a preceding synthetic process. These conditions allow nanoparticles to grow to the point wherein they collapse in a continuous metallic feature.

Several growth processes are disclosed that vary in the method by which the metal atom (zero oxidation number) is generated from its ion.

The first case (case 1) makes use of the generation of the metal atom from the metal ion using an electron beam. The electron beam can directly reduce the silver ion or can generate a radical anion that then reduces the metal ion or can ionize a molecule and the electron then reduces the metal ion.

An advantage of case 1 is the versatility in the metal line resolution that can be achieved, which can range from several microns (with the use of a mask and a large electron beam) to few nanometers (with the use of conductive scanning probe microscopy tips, for example). FIG. 1 is a schematic illustration of a case 1 growth process. In the upper drawing an injected electron reduces a metal ion; in the lower part it generates a radical anion that subsequently reduces the metal ion. In particular, conductive tip Atomic Force Microscopy, in which the tip of the microscope approaches a film in tapping mode, can be used as source of electrons. Once it is positioned within few nanometers away from the surface of the nanoparticles it injects electrons into the nanoparticle film to generate metal lines whose thickness may be just a few nanometers.

The second case (case 2) is that wherein metal ions are reduced to their zero oxidation number through a local increase in temperature which is caused by absorption of light energy (preferably a laser beam) by a dye molecule and the transfer of the absorbed energy to heat. Materials and Methods for the non-linear local heating of materials are described in U.S. Pat. No. 6,322,931 which is incorporated herein by reference.

Figure 2:
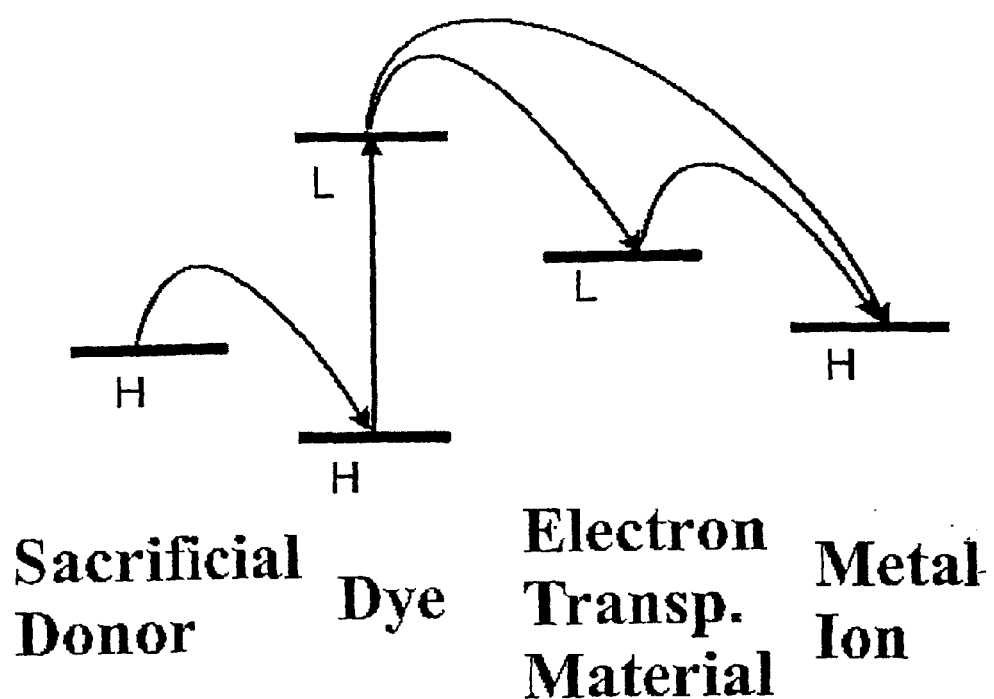
FIG. 2. Energy level scheme for sensitized metal ion reduction.

The third case (case 3) is to photoexcite a molecule so as to create an excited state, thus increasing the reducing potential of the molecule by a sufficient amount that it can reduce the metal ion, whereas the ground state could not. In this process the dye is oxidized so, in many cases, a sacrificial donor may be required in order to regenerate it. FIG. 2 illustrates an energy level scheme for sensitized metal ion reduction. In the first step (black) an electron is promoted from the highest occupied molecular orbital (HOMO) level of the dye to one of its excited states. From this level the electron either goes directly to the metal ion (red) or first to the lowest unoccupied molecular orbital (LUMO) of an electron transporting material (blue) and then to the metal ion. Subsequently, an electron may transfer (green) from the HOMO of the sacrificial donor to the HOMO of the dye, thereby regenerating the neutral dye. The sacrificial donor and the electron transporting material are not necessary.

The feature size resolution achievable in this case depends on the type of photo excitation. The lower limit on the feature size can be several microns is diffraction limited for one photon (case 3a) irradiation, is potentially smaller for multiphoton irradiation, due to thresholding effects (case 3b), and is in the order of tens of nanometers for near field irradiation (case 3c). In this case the limit is determined by the near-field source dimension and its position relative to the film.

Figure 3:
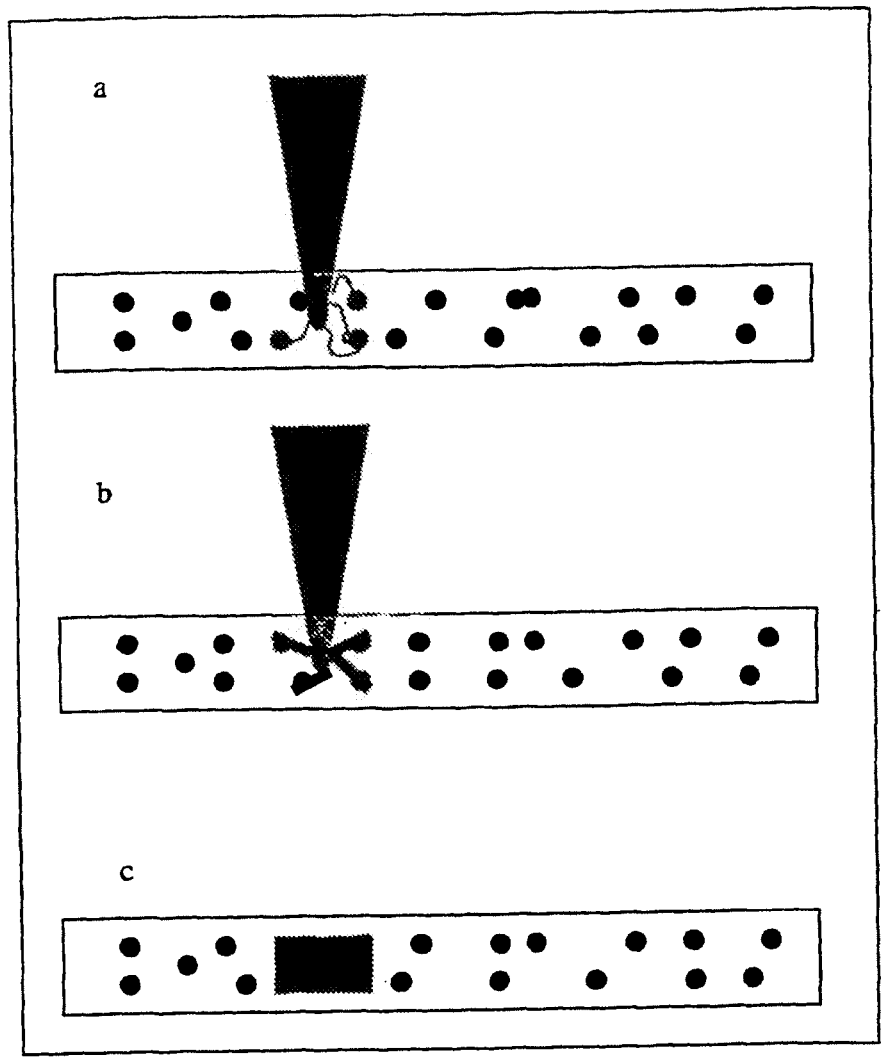
FIG. 3. Illustration of writings of metal features in a nanoparticle composite.

FIG. 3 illustrates the writing of metal features in a nanoparticle composite. The red cone represents the laser beam and the darker spot at its end represents the focus of the beam. The gray rectangle is the composite film containing the dye and the salt in it, while the blue circles represent the nanoparticles. Upon exposure, growth and coalescence, a metal pattern is formed. In the upper part (a), the metal atoms are formed in the beam focus and they start to migrate toward nanoparticles, then (b) the nanoparticle starts to grow, and finally (c) a continuous metal feature is formed. This scheme is appropriate to case 2 and 3 methods.

Preferred Embodiments

Preferred examples will be given in the following section to illustrate methods of fabrication of metal. These examples are by no means exhaustive and it should be clear to one skilled in the art that numerous other procedures can be employed based upon the basic principles of the invention disclosed herein. Two different classes of compositions can be used to generate metal features. In the first class the metal nanoparticles act as their own matrix and in the second class the metal nanoparticles are dopants in a host matrix.

Class I

In the first embodiment the material is composed of:

i) ligand coated metal nanoparticles coated by one or more types of organic ligands. In some cases it is advantageous to use a mixture of organic ligands, as described above. In addition, molecules as described in (ii) (below) could be attached to one or more types of ligands coating the particle.

ii) a molecule (dye) whose molecular orbital energy levels are suitable for photoreduction of the corresponding metal salt or whose linear or nonlinear optical absorption is able to generate the sufficient heat to cause reduction the metal salt. This component can be dissolved in the nanoparticle matrix or covalently bonded to the nanoparticle as one of the ligands, or as the only ligand;

iii) a metal salt; and iv) a sacrificial donor, that is a molecule whose molecular orbital levels are of appropriate energy to reduce the cation of the dye described in (ii) above, which is formed upon photoreduction of the metal ion or upon electron-beam exposure. In this manner, the original dye can be regenerated and can once again act as a reducing agent of metal. The component may be part of the host matrix structure. In some cases this component may not be necessary.

Preferred concentrations (in weight percent, based on the total weight of the composition) for each component of the class I system are as follows and are chosen so as to add to a total of 100%:

Component (i): 55 to 100%, including all values and subvalues therebetween, especially including 60, 65, 70, 75, 80, 85, 90 and 95%;

Component (ii): 0 to 15%, including all values and subvalues therebetween, especially including 2, 4, 6, 8, 10, 12 and 14% (0 applies for the case where the nanoparticles have dye terminated ligands in their outside shell);

Component (iii): 0 to 15%, including all values and subvalues therebetween, especially including 2, 4, 6, 8, 10, 12 and 14%;

Component (iv): 0 to 10%, including all values and subvalues therebetween, especially including 2, 4, 6, and 8%.

Class II

In the second embodiment a material acts as a host matrix in which the other components i)-iv) are dispersed or dissolved:

v) a matrix that dissolves all the other components. This matrix can be:

a) a polymer;
b) a glass;
c) a highly viscous liquid;
d) a liquid crystalline material or polymer, or mesoscopic phase; and
e) a porous crystalline or amorphous solid.

In the case (a) of component (v) there could be circumstances in which it is particularly advantageous to add an additional component (vi):

vi) a plasticizer, that is a molecule capable of lowering the glass transition temperature of the polymer, thereby rendering its mechanical properties more suitable for the application.

In both cases the component (ii) is not necessary when the source of irradiation is an electron beam.

Preferred concentrations (in weight percent, based on the total weight composition) of the for each component of the class II system are as follows and are chosen so as to add to a total of 100%:

Component (i): 0.05% to 25%, including all values and subvalues therebetween, especially including 0.1, 0.2, 0.5, 1, 2, 3, 4, 5, 10, 15 and 20%;

Component (ii): 0 to 15%, including all values and subvalues therebetween, especially including 2, 4, 6, 8, 10, 12 and 14% (0 applies where the nanoparticles have dye terminated ligands in their outside shell, or either the host or the plasticizer have a suitable dye as subunit);

Component (iii): 0 to 25%, including all values and subvalues therebetween, especially including 5, 10, 15 and 20%;

Component (iv): 0 to 60%, preferably from 20% to 60%, including all values and subvalues therebetween, especially including 10, 20, 30, 40 and 50%;

Component (v): 0.5-99.5%, including all values and subvalues therebetween, especially including 1, 20, 30, 40, 50, 60, 70 and 80%; and Component (vi): 0 to 70%, including all values and subvalues therebetween, especially including 10, 20, 30, 40, 50 and 60%.

Description of the Components

Component (i): Metal Nanoparticles

Preferred examples of component (i) are:

i1) metal (e.g. silver, gold, copper, and iridium) nanoparticles with dimensions from 1 to 200 nm (diameter) coated with organic ligands (Kang, S. Y. & Kim, K., Comparative study of dodecanethiol-derivatized silver nanoparticles prepared in one-phase and two-phase systems. *Langmuir*, 14, 226-230 (1998); Brust, M., Fink, J., Bethell, D., Schiffrin, D. J. & Kiely, C., Synthesis and Reactions of Functionalized Gold Nanoparticles. *Journal of the Chemical Society-Chemical Communications*, 1655-1656 (1995); Brust, M., Walker, M., Bethell, D., Schiffrin, D. J. & Whyman, R., Synthesis of Thiol-Derivatized Gold Nanoparticles in a 2-Phase Liquid-Liquid System. *Journal of the Chemical Society-Chemical Communications*, 801-802 (1994));

i2) nanoparticles composed of alloys of metals coated with organic ligands (Link, S., Burda, C., Wang, Z. L. & El-Sayed, M. A., Electron dynamics in gold and gold-silver alloy nanoparticles: The influence of a nonequilibrium electron distribution and the size dependence of the electron-phonon relaxation. *Journal of Chemical Physics*, 111, 1255-1264 (1999); Link, S., Wang, Z. L. & El-Sayed, M. A., Alloy formation of gold-silver nanoparticles and the dependence of the plasmon absorption on their composition. *Journal of Physical Chemistry B*, 103, 3529-3533 (1999));

i3) uncoated metal nanoparticles (for the second embodiment) (Heilmann, A. & Kreibig, U., Optical properties of embedded metal nanoparticles at low temperatures. *European Physical Journal-Applied Physics*, 10, 193-202 (2000)); and i4) metallic nanoshells whose cores are semiconductor, metal oxide, silicate, polymer, or biopolymer nanoparticles and whose outer shells are metallic, the metallic part being with or without (for the second embodiment) an organic coating (Wiggins, J., Carpenter, E. E. & O'Connor, C. J., Phenomenological magnetic modeling of Au: Fe: Au nanoonions. *Journal of Applied Physics*, 87, 5651-5653 (2000); Carpenter, E. E. et al., Synthesis and magnetic properties of gold-iron-gold nanocomposites. *Materials Science and Engineering a-Structural Materials Properties Microstructure and Processing*, 286, 81-86 (2000)).

Components i1, i2, i3 are made of nanoparticles that can be coated by organic ligands. These ligands are molecules that are essentially composed of three parts in the following scheme: A-B-C.

Part A is a molecular or ionic fragment that has at least one atom having a lone pair of electrons that can bond to a metal nanoparticle surface, or is an unsaturated molecular or ionic fragment that can bond to the metal nanoparticle surface, and includes a point of attachment to connect the fragment to B. Some examples include: $^{\ominus}S-$, $^{\ominus}O-$, $^{\ominus}O_2C-$, $^{\ominus}S-S-R$, $^{\ominus}_3S-$, $^{\ominus}S_2C-NR-$, $^{\ominus}O_2C-NR-$, $P(R_1R_2)-$, $N(R_1R_2)-$, $O(R_1)-$, $P(OR_1)(OR_2)O-$, and $S_2(R)-$, where $R$, $R_1$, and $R_2$ may be independently selected from the group consisting of —H, a linear or branched alkyl chain containing 1 to 50 carbon atoms, phenyl or other aryl groups, and hetero aromatic groups.

Part B is an organic fragment that has two points of attachment, one for connecting to part A and one for connecting to part C. This fragment serves to provide bulk around the nanoparticle to help stabilize it against fusing with other nanoparticles. Part B can be nothing (a single bond) or can be independently selected from the group consisting of a methylene chain with 1 to 50 carbon atoms, a phenylene chain with 1 to 20 phenyls, a thiophenylene chain with 1 to 20 thiophenylenes, phenylene vinylene chains with 1 to 20 phenyl vinylenes, branched hydrocarbon chains with 2 points of attachment, ethylene oxide chains with 1 to 20 ethylene oxides, oligo(vinyl carbazole) chains with 1 to 20 vinyl carbazole units and points of attachment at each end of the chain.

Part C is a molecular fragment with one point of attachment that connects to fragment B. This group may be used to impart specific functions to the exterior of the ligand coated nanoparticle such as, comparability with a matrix, photoreducing properties, two-photon absorption properties, self-assembly properties, chemical attachment properties. Part C can be independently selected from the group consisting of —H, phenyl, naphthyl, anthryl, other aryl groups, N-carbazoyl, α-fluorenyl, —SiOR$_3$, —SiCl$_3$, any group described as a possible Part A fragment, photoreducing dyes, two-photon absorbing chromophores, a multi-photon absorbing chromophore methylene blue, oligonucleotide strand, peptide chain, or any group described as a possible part B fragment where one of the points of attachment is substituted with a hydrogen.

The preferred nanoparticles of the present invention may have a mixture of two or more types of ligands, each one with its own characteristic groups and functionality.

For the sake of clarity some specific examples of ligands that have been used for class (i1) are mentioned hereafter:

| Ligand structure | Ligand chemical name | Ligand label |
|---|---|---|
| ~~~~SH | Octanethiol | $I_1$ |
| ~~~~~~SH | Dodecanethiol | $I_2$ |
| ~~~SH | Heptanethiol | $I_3$ |

-continued

| Ligand structure | Ligand chemical name | Ligand label |
|---|---|---|
| [structure: carbazole-N-(CH2)8-SH] | 8-(9H-carbazol-9-yl)octane-1-thiol | $I_4$ |
| [structure: carbazole-N-(CH2)12-SH] | 8-(9H-carbazol-9-yl)dodecane-1-thiol | $I_5$ |
| [structure: HOOC-CH2CH2-SH] | 3-mercaptopropanoic acid | $I_6$ |
| [structure: Bis[2-(dimethylamino)ethyl] ester with SH] | Bis[2-(dimethylaxnino)ethyl]2-mercaptopentadioate | $I_7$ |
| [structure: complex stilbene dialdehyde with dithiolane] | 3-{2,5-bis[(E)-2-(4-formyl-(phenyl)ethenyl]phenoxy}propyl-4-(1,2-dithiolan-3-yl)butanoate | $I_8$ |

Examples of preferred metal and ligand combinations are the following:

| Metal | Ligand | Given name |
|---|---|---|
| silver | $I_1$ | nAg1 |
| silver | $I_2$ | nAg2 |
| silver | $I_3$ | nAg3 |
| silver | $I_4$ | nAg4 |
| silver | $I_7$ | nAg5 |
| silver | $I_1 + I_4$ | nAg6 |

-continued

| Metal | Ligand | Given name |
|---|---|---|
| silver | $I_1 + I_2$ | nAg7 |
| silver | $I_1 + I_7 + I_4$ | nAg8 |
| silver | $I_1 + I_4 + I_8$ | nAg9 |
| gold | $I_1$ | nAu1 |
| gold | $I_2$ | nAu2 |
| copper | $I_1$ | nCu1 |
| copper | $I_1$ | nCu2 |

Component (ii) Photoreducing Dyes

Preferred examples of component (ii) are:

Class 1: Centrosymmetric bis(aldehyde)-bis(styryl)benzenes

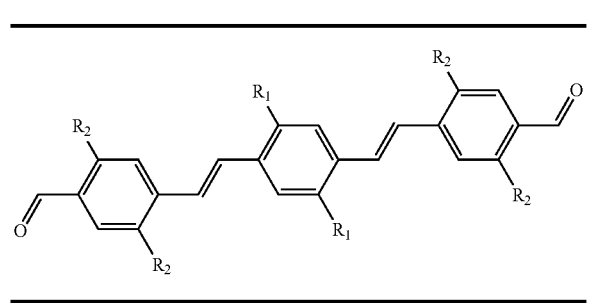

| | | |
|---|---|---|
| $R_1 = H$ | $R_2 = H$ | 1a |
| $R_1 = OCH_3$ | $R_2 = H$ | 1b |
| $R_1 = OCH_3$ | $R_2 = OCH_3$ | 1c |
| $R_1 = OC_{12}H_{25}$ | $R_2 = H$ | 1d |
| $R_1 = OC_{12}H_{25}$ | $R_2 = OCH_3$ | 1e |

Class 2: Non-centrosymmetric bis(aldehyde)-bis(styryl)benzenes

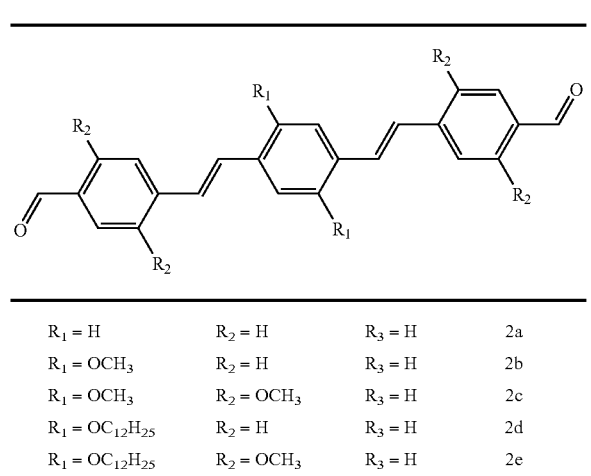

| | | | |
|---|---|---|---|
| $R_1 = H$ | $R_2 = H$ | $R_3 = H$ | 2a |
| $R_1 = OCH_3$ | $R_2 = H$ | $R_3 = H$ | 2b |
| $R_1 = OCH_3$ | $R_2 = OCH_3$ | $R_3 = H$ | 2c |
| $R_1 = OC_{12}H_{25}$ | $R_2 = H$ | $R_3 = H$ | 2d |
| $R_1 = OC_{12}H_{25}$ | $R_2 = OCH_3$ | $R_3 = H$ | 2e |

Class 3: Centrosymmetric acceptor terminated bis(styryl)benzenes

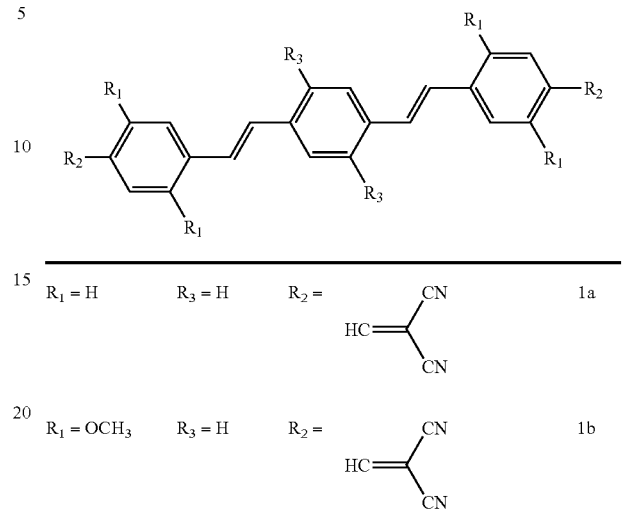

| | | | |
|---|---|---|---|
| $R_1 = H$ | $R_3 = H$ | $R_2 =$ HC=C(CN)(CN) | 1a |
| $R_1 = OCH_3$ | $R_3 = H$ | $R_2 =$ HC=C(CN)(CN) | 1b |
| $R_1 = OCH_3$ | $R_3 = OCH_3$ | $R_2 =$ (1,3-diethyl-2-thioxo-dihydropyrimidine-4,6-dione)=CH– | 1c |
| $R_1 = OC_{12}H_{25}$ | $R_3 = H$ | $R_2 =$ (1,3-diethyl-2-thioxo-dihydropyrimidine-4,6-dione)=CH– | 1d |

Class 4: Non-centrosymmetric acceptor terminated bis(styryl)benzenes

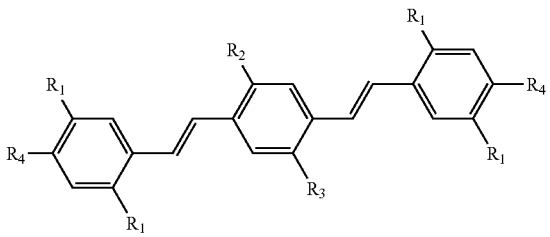

| | | | | |
|---|---|---|---|---|
| $R_1 = H$ | $R_2 = OCH_3$ | $R_3 = H$ | $R_4 =$ HC=C(CN)(CN) | 1a |

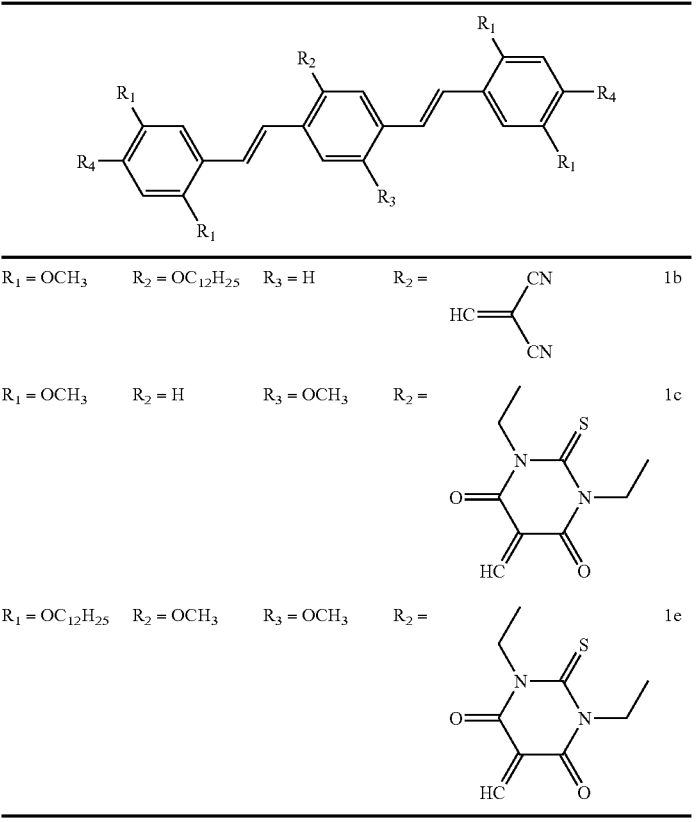

| | | | |
|---|---|---|---|
| $R_1 = OCH_3$ | $R_2 = OC_{12}H_{25}$ | $R_3 = H$ | $R_2 =$ 1b |
| $R_1 = OCH_3$ | $R_2 = H$ | $R_3 = OCH_3$ | $R_2 =$ 1c |
| $R_1 = OC_{12}H_{25}$ | $R_2 = OCH_3$ | $R_3 = OCH_3$ | $R_2 =$ 1e |

Class 5: Other dyes

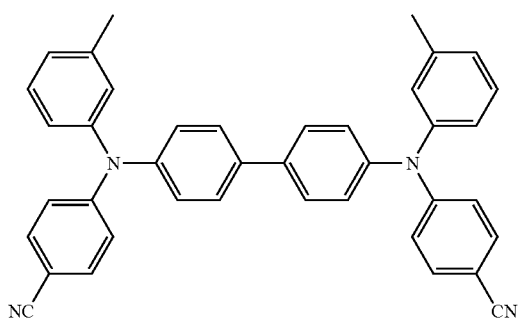

The dye can be a donor-acceptor dye such as those described in U.S. Pat. Nos. 5,804,101; 6,090,332; 5,670,090; 5,670,091 and 5,500,156 which are included herein by reference.

Component (iii) Metal Salts

Preferred examples of component (iii) are any metal (I) soluble salt, including silver tetrafluoroborate ($AgBF_4$); silver hexafluoroantimonate ($AgSbF_6$); silver diethyldithiocarbamate ($C_3H_{10}NS_2Ag$); silver nitrate ($AgNO_3$); trimethyl phosphite cuprous iodide ($ICuP(OCH_3)_3$); and chlorotrimethyl phosphite gold ($ClAuP(OCH_3)_3$).

Component iv): Matrices

The main requirement of this component is to have the ability to dissolve all the other components and to form a homogeneous composite.

Preferred examples of component (v) are:

a) Polymer $a_1$: poly(9-vinylcarbazole)

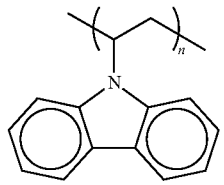

In most of the examples given below the polymer actually used was the secondary standard (Aldrich chemicals) whose $M_n=69,000$;

Polymer $a_2$: poly(2-{[11-(9H-carbazol-9-yl)undecanoyl]oxy}ethyl-2-methylacrylate) PCUEMA

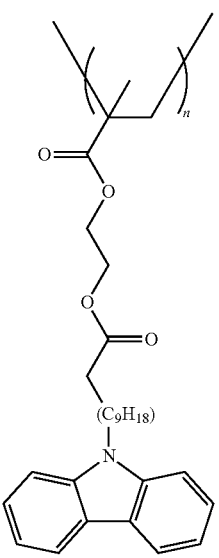

Polymer $a_3$: poly(4-Chloro Styrene); and

Polymer $a_4$: poly(methylmethacrylate) PMMA;

b) $SiO_x$, organically modified $SiO_x$ materials, $TiO_x$, $(SiO_x)_n (TiO_x)_m$ c) viscous liquid host:

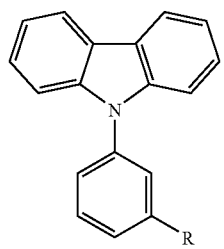

| | |
|---|---|
| R = CH$_3$ | c$_1$ |
| R = OCH$_3$ | c$_2$ |

Other Components

Preferred examples of component (iv) and of component (vi) are ethylcarbazole which is a good plasticizers for polyvinyl carbazole, and a sacrificial donor;

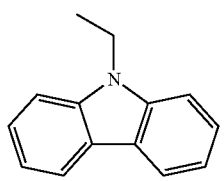

terminal di(9-carbazoyl) alkanes which are good plasticizer and sacrificial donors;

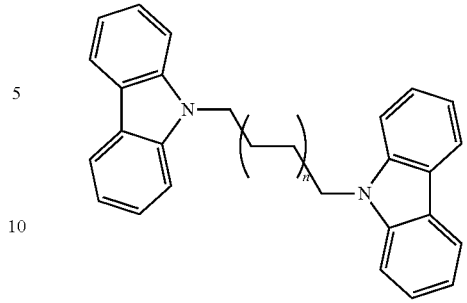

$0 \leq n \leq 10$ and the following molecule which is a sacrificial donor:

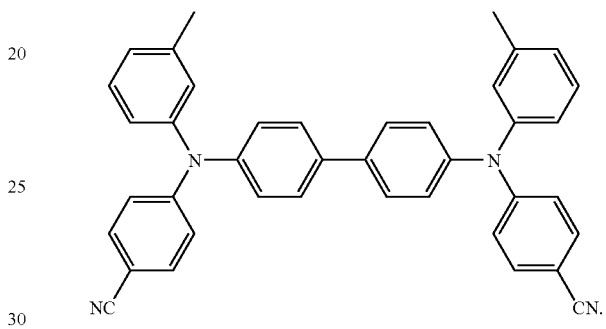

Applications of the present invention include: writing of metal line diffraction gratings for light waves in integrated optics, patterning of microelectrode arrays for applications in electrochemistry or biology, patterning of metal wires for integrated circuit interconnection, for example in hard wiring of security codes on chips, and in chip repair. Additional applications include: fabrication of nanometer size metal wires, single electron transistors, and other components for nanoelectronics applications; 3D interconnection of electronic components in multilevel integrated circuits; fabrication of metallic devices for microsurgical applications; antennae and arrays thereof for terahertz radiation, formation of mirrors of different angles of inclination within a thin film metallic photonic crystal and photonic crystal waveguides, and metallic microsensors, micro-resonators and micro-electromechanical structures. This invention can be used for the wiring of nanoscale and single molecule based electronic devices.

Further, the present invention offers the following advantages over the currently available technology:

i) Continuous metal lines can be formed in three dimensional patterns with a resolution in the micro- or nanoscale with few limitations on the shape of the pattern.

ii) The process does not require the generation of high temperatures as needed in pyrollytic processes, and thus can be utilized in the integration of nanoscale devices or in conjunction with thermally sensitive substrates.

iii) Metal patterns or structures can be produced on a wide variety of substrates. Preferred substrates are silicon, glass or plastic substrates, all of which may be covered with, for example, indium-tin-oxide (ITO). Further preferred substrates are Au, Ag, Cu, Al, $SiO_x$, ITO, a hydrogel or a biocompatible polymer.

iv) The material systems are easy to process and simple to handle, as opposed to highly toxic gas phase organometallic precursors as typically used in chemical vapor deposition.

v) Inert atmospheres are not required.

vi) High vacuum equipment is not needed.

vii) The fact that the process is thresholded allows the sample to be handled under ambient lighting and thermal conditions, thus giving the samples exceptional long-term stability, for example, a shelf life of 8 months in the dark.

However, the process of the present invention is not limited to ambient temperatures. If Class I compositions are used, a temperature range of from −270 to 200° C. is preferred. If Class II compositions are used, a temperature range of from −250 to 150° C. is preferred.

Thus, the present invention relates to a novel process for directly writing three-dimensional metal patterns in a material requiring low energy as described in Examples 20 and 21, below and low temperature as stated above. The versatility of the compositions with regard to the type of metal nanoparticles used and the type of dye offers many possibilities for engineering of materials for specific applications.

There are many possible applications that can be embodied based on the present invention.

One set of applications involves the ability to induce large changes in the physical properties in a matrix generated by the presence of dispersed nanoparticles (1-100 nm), dispersed small metal island (100 nm-100 μm), quasi-continuous (percolated) metal or continuous metal lines. These modifications alter the optical properties, such as refractive index of a solid state matrix, and such changes in properties are useful in optical data storage, in creating diffractive optical devices, or in defining waveguiding regions for integrated optics, or writing of metal line diffraction gratings for light waves in integrated optics.

This invention can be used for optical data storage in many formats. Information can be stored in 3D using two-photon excitation to write bits comprised of regions containing metal nanoparticles or metal islands. A focused beam is useful in this regard, but crossing beams or interfering beams, such as in holography, can be employed.

Another example of optical data storage is where the photosensitive metal nanoparticle composite is used as an optical recording layer for recordable compact disk-like applications.

A very attractive application is for ultra-high density 2D optical data storage using near field light source to write very small bits (~100 nm or smaller).

Other optical applications include: fabrication of reflective polarizers, switchable gratings, and micromirrors.

A second set of applications of the present invention uses direct patterning of conductive metal features. They include: patterning of microelectrode arrays for applications in electrochemistry or biology, patterning of metal wires for integrated circuit interconnection, for example in hard wiring of security codes on chips, and in chip repair. Additional applications include: fabrication of nanometer size metal wires, single electron transistors, and other components for nano-electronics applications; 3D interconnection of electronic components in multilevel integrated circuits; writing of contacts on soft materials such as organic light emitting diodes or organic field effect transistors; fabrication of metallic devices for microsurgical applications, such as needles and stents (McAllister, D. V., Allen, M. G. & Prausnitz, M. R., Micrafabricated microneedles for gene and drug delivery. *Annual Review of Biomedical Engineering*, 2, 289-313 (2000); Polla, D. L. et al., Microdevices in medicine. *Annual Review of Biomedical Engineering*, 2, 551-576 (2000); Santini, J. T., Richards, A. C., Scheidt, R., Cima, M. J. & Langer, R., Microchips as controlled drug-delivery devices. *Angewandte Chemie-International Edition*, 39, 2397-2407 (2000); Rymuza, Z., Control tribological and mechanical properties of MEMS surfaces. Part 1: critical review. *Microsystem Technologies*, 5, 173-180 (1999)); and micro-electromechanical structures (Walker, J. A., The future of MEMS in telecommunications networks. *Journal of Micromechanics and Microengineering*, 10, R1-R7 (2000); Spearing, S. M., Materials issues in microelectromechanical systems (MEMS). *Acta Materialia*, 48, 179-196 (2000); Lofdahl, L. & Gad-el-Hak, M., MEMS applications in turbulence and flow control. *Progress in Aerospace Sciences*, 35, 101-203 (1999)). The materials and methods of this invention can be used for the wiring of nanoscale and single molecule based electronic devices (Quake, S. R. & Scherer, A., From micro- to nanofabrication with soft materials. *Science*, 290, 1536-1540 (2000)).

Yet other applications can include uses of written metal features in hybrid electrooptical applications, where both the electrical and optical properties are exploited. An example could be an electrode array shaped so to act as a diffractive grating that may be backfilled by liquid crystalline material whose alignment is controlled by the applied field. The liquid crystal alignment would control the optical properties of the grating.

Writing of conductive metal features is also of advantage to applications in microfluidics. For example, in the fabrication of electroded channels to control fluid flow, to drive electrophoretic separations, to drive electrochemical reactions, or to monitor the dielectric properties of the channel contents.

Another application of the invention is the patterning or fabricating of templates (Ostuni, E., Yan, L. & Whitesides, G. M., The interaction of proteins and cells with self-assembled monolayers of alkanethiolates on gold and silver. *Colloids and Surfaces B-Biointerfaces*, 15, 3-30 (1999)) which can be used for deposition, self-assembly, or templated growth of other materials or compounds. For example, patterned metals surfaces can be used for the generation of patterned arrays of self-assembled molecules such as thiols, carboxylic acid or other functionalized compounds. One can drive reactions at the metal surfaces by using gas phase, solution phase or solid phase reactants. The patterned surfaces can also be exploited for the patterned catalysis of chemical reactions.

Yet another application of the ability to write metal features in a free form fashion is to create electrode patterns which can be used to direct the growth and interconnection of neurons or other types of cells.

Having generally described this invention, a further understanding can be obtained by reference to certain specific examples which are provided herein for purposes of illustration only, and are not intended to be limiting unless otherwise specified.

EXAMPLES

Discussion of the Examples

The following discussion is meant to encompass a set of examples of some important experiments and to assist in the understanding of the examples section.

This discussion mainly focuses on the possibility to write 3D metallic patterns with multiphoton irradiation (class II, case 3). This, is a good test for all other classes and cases described above. In fact, most of the steps involved in the present invention are common to all the different cases described and namely they are 1. the synthesis of highly soluble nanoparticles, 2. the preparation of a homogeneous and optical quality matrix, and 3. the post-writing processing and characterization.

These steps are common to all different kinds of writing processes. The solution of the problems involved in these parts constitutes a large part of the present invention.

To generate a homogeneous matrix with good optical quality it is necessaries to find (i) a solvent or a solvent mixture capable of dissolving all the components and (ii) a matrix (a polymer) that is capable of dissolving all the components in solid state. Preferred solvents are chloroform, dichloromethane, acetonitrile, acetone, water, hexane, heptane, pentane, toluene, dichlorobenzene, dichloroethane and mixtures thereof. A solution of chloroform/acetonitrile 20/1 in volume was found to be the best one for this purpose and polymers $a_1$ and $a_4$ have the desired properties to efficiently dissolve a wide variety of silver salts, while PMMA shows the ability of dissolving copper salts. A more complex problem is the solubility of nanoparticles both in organic solvents and in solid matrices.

It has been found that despite the wide variety of ligands that can be attached on nanoparticles their solubility remains limited. In order to overcome this problem it is important to use nanoparticles with a mixture of ligands. Examples of suitable ligands have been provided above. The use of a mixture of ligands adds entropy to the system and mainly limits the interdigitation between ligands that is the main cause for poor solubility (Voicu, R., Badia, A., Morin, F., Lennox, R B. & Ellis, T. H., Thermal behavior of a self-assembled silver n-dodecanethiolate layered material monitored by DSC, FTIR, and C-13 NMR spectroscopy. *Chemistry of Materials,* 12, 2646-2652 (2000); Sandhyarani, N., Pradeep, T., Chakrabarti, J., Yousuf, M. & Sahu, H. K, Distinct liquid phase in metal-cluster superlattice solids. *Physical Review B,* 62, 8739-8742 (2000); Sandhyarani, N. & Pradeep, T., Crystalline solids of alloy clusters. *Chemistry of Materials,* 12, 1755-1761 (2000); Badia, A. et al., Self-assembled monolayers on gold nanoparticles. *Chemistry-a European Journal,* 2, 359-363 (1996)). In addition, particular groups were used to make the particle more soluble in their host, e.g. carbazole terminated alkanethiol as one of the ligands to make the particle soluble in polyvinylcarbazole.

The best strategy to synthesize these nanoparticles was the use of a monophase reaction in ethanol (Example 1), the simple addition of different ligands in different ratios was effective in obtaining particles with different ligands on their outer shell and with a drastically reduced enthalpy of melting (Example 2).

If the particles are soluble enough, the casting of the films becomes relatively easy and can be done either via solvent evaporation (Example 8) or by spin coating (Example 17). In the first case the achievable range of thickness spans from few microns (Example 13) to 200 μm. The maximum silver salt loading ratio achievable in polymer $a_1$ is 15% (by weight) for silver tetrafluoroborate; in the same polymer 5% is the maximum for dye 1d, and 3% is the maximum for nAg6 (Example 9). The loading ratio maxima are slightly higher in the case of spin coating techniques.

The solid state growth of metal nanoparticle has been explored and proven through a series of experiments involving the photochemical reduction of silver ions in a matrix. The carbazole moiety plays the role of sacrificial anode too, thus allowing the possibility of doping the silver with a smaller amount of photoreducing dye.

Polyvinylcarbazole has a $T_g$ of around 200° C. so a plasticizer was used in order to lower the glass transition temperature to close to room temperature. A well known plasticizer for this polymer has been used: ethylcarbazole. The range of compositions of the film that was mostly used was (all percentages in weight) 30-50% of plasticizer, 3-5% dye 1d, 10-15% $AgBF_4$, 0.2-3% nAg6. The amount of plasticizer includes all values and subvalues therebetween, especially including 33, 36, 39, 42, 45 and 48% by weight. The amount of dye includes all values and subvalues therebetween, especially including 3.2; 3.4; 3.6; 3.8; 4.0; 4.2; 4.4; 4.6 and 4.8% by weight. The amount of $AgBF_4$ includes all values and subvalues therebetween, especially including 10.5; 11; 11.5; 12, 12.5; 13; 13.5; 14 and 14.5% by weight. The amount of nAg6 includes all values and subvalues therebetween, especially including 0.4; 0.6; 0.8; 1.0; 1.2; 1.4; 1.6; 1.8; 2.0; 2.2; 2.4; 2.6 and 2.8% by weight.

Reference films with the same composition but without nanoparticle were also made. All the films made in this way had good optical quality and were perfectly homogeneous by naked eye inspection, though some defect could be observed, none was perfect under the microscope (60× magnification).

All films were irradiated with a tightly focused infrared light source (from 700 to 800 nm 100 fs pulse-length) generated silver lines (Example 22) and or islands (squares in particular) while the corresponding reference film did not generate any visible feature. Further inspections of the reference film either using optical spectroscopy or TEM microscopy lead to the conclusion that small nanoparticles which have a large size dispersion are generated. The features generated in polymer films that contained metal nanoparticles could be separated from their matrix via dissolution of the matrix in an appropriate solvent mixture and then studied with XPS (Example 10) and SEM techniques (Example 9).

XPS Results show that the generated features are made mainly of silver in its zerovalent (metallic). The latter technique shows that three-dimensional features can be formed and that the generated lines are continuous up to a micron level.

A more complex experiment was done in order to study our process with a TEM microscope: three identical films were castes of copper grids (Example 11) and two of them were exposed to irradiation with a nanosecond laser (532 nm), the first one was irradiated by a single laser shot (125 mJ) and the second one by three shots.

Figure 9:
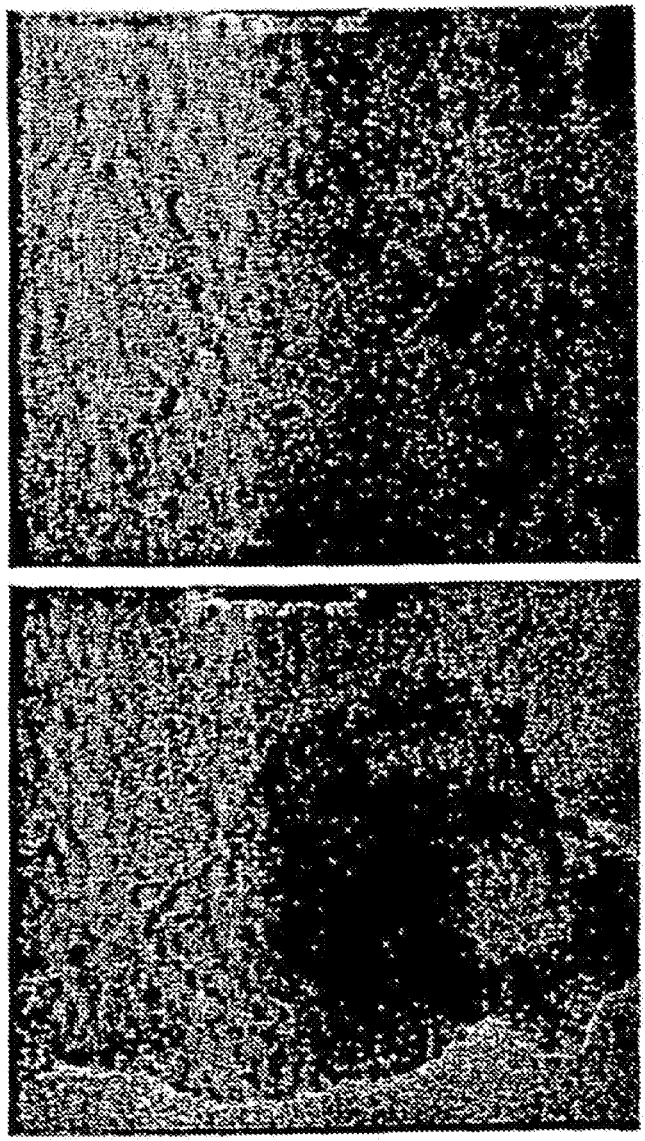
FIG. 9. TEM images illustrating growth of metal nanoparticle in a composite film upon exposure to either one or three laser pulses from a ns pulsed laser.

The result was that the average radius of the particle doubled after one laser shot but their number per unit area stayed the same, all in agreement with the proposed mechanism (FIG. 9).

Many variations are possible, including the use of near field excitation. In order to check the feasibility of this variation the threshold power required for the writing was check and it was discovered to be approx. $10^8$ W/m$^2$ for single photon excitation (Example 20) and $10^9$ W/m$^2$ for two photon excitation (Example 21). The power thresholds are consistent with those available for near field writing.

The experimental section contains many different kinds of films that have been prepared using different kind of polymers (Example 15) or matrices, dyes (Example 14), salts or nanoparticles (Example 12).

Figure 8:
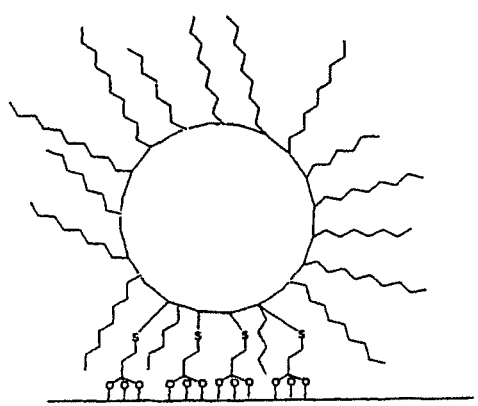
FIG. 8. Schematic drawing of the attachment of a ligand capped metal nanoparticle to a thiol functionalized glass substrate.

Important issues in the developing step have been solved. In order to provide a chemical bond between the structures and the substrate a two step method for functionalizing the substrate was developed. In the first step a monolayer of thiol terminated molecules is created in the glass substrate. This monolayer is bound to the substrate via trimethoxy silane functionalities. In the second step a nanoparticle monolayer is introduced on the first monolayer and the particles are chemically bound to the thiols. This kind of functionalized substrate drastically improved the adhesion and success in the developing step. FIG. 8 is a schematic drawing of the attachment of a ligand capped metal nanoparticle to a thiol functionalized glass substrate.

In order to test for the importance of the presence of silver nanoparticles in the precursor, we irradiated film F13 (Example 25) for more than one hour in a UV chamber to see if any characteristic nanoparticle absorption band would arise in the optical absorption spectrum or if any metal feature could appear. Only a bleaching of the dye band was observed and absolutely no evidence of continues silver metal or nanoparticle formation, (as evidenced by optical absorption) was observed, even under such extreme irradiation conditions.

Functionalized Metal Nanoparticles for the Fabrication of Continuous Metal Features Silver nanoparticles were synthesized with coatings of different organic ligands. Some of the ligands possessed groups capable of reducing, from their excited state, silver ions to the neutral atom. The structures of these ligands are shown in the schematic drawing below. Three dye-ligands are used to synthesize electron and photo-active nanoparticles. The names and the ligand shell composition of the particles used in some experiments are listed in the legend below.

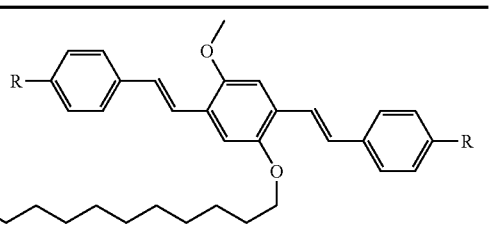

|  |  |  |
| --- | --- | --- |
|  | R = $NO_2$ | $I_9$ |
|  | $N(CH_2CH_3)_2$ | $I_{10}$ |
|  | HC=O | $I_{11}$ |
| Metal | ligands | Given Name |
| Silver | $1_1 + 1_2 + 1_9$ | nAg10 |
| Silver | $1_1 + 1_2 + 1_{10}$ | nAg11 |
| Silver | $1_1 + 1_2 + 1_{11}$ | nAg12 |
| Silver | $1_9$ | nAg13 |

The synthesis of the ligand coated particles was a place exchange reaction (Hostetler, M. J., Templeton, A. C. & Murray, R. W. Dynamics of place-exchange reactions on mono layer-protected gold cluster molecules. *Langmuir* 15, 3782-3789 (1999)). Starting from a solution of nAg7 and the desired ligand we were able to synthesize particles with dye molecules in their outside shell. A different synthesis was used to obtain nanoparticles completely coated by dye attached ligands (Example 29). In this case silver ions were reduced with $NaBH_4$ in the presence of ligand $I_9$.

Mixtures of these particles and a silver salt gave rise to larger particles (up to the continuous limit) upon excitation (light or electron beams) both in solution and the solid state. A few examples, that are not representative of the full potentiality of these particles, will be discussed hereafter. The main advantage of these materials systems that is that films of these particles are precursors for both e-beam and light-induced growth of continuous metal features.

In order to test the reactivity of composite materials containing dye-coated particles, a series of experiments were performed on a set of four films:

Films containing nanoparticles with reducing dyes on their ligand shell (nAg11) and 2% wt. of silver salt ($AgBF_4$). (F14, F18)

Films of nanoparticles with reducing dyes on their ligand shell (nAg11) and no silver salt. (F15, F19)

Films of nanoparticles with no reducing dyes on their ligand shell (nAg7) and 2% wt. of silver salt ($AgBF_4$). (F16, F20)

Films of nanoparticles with no reducing dyes on their ligand shell (nAg7) and no silver salt. (F17, F21)

Figure 16:
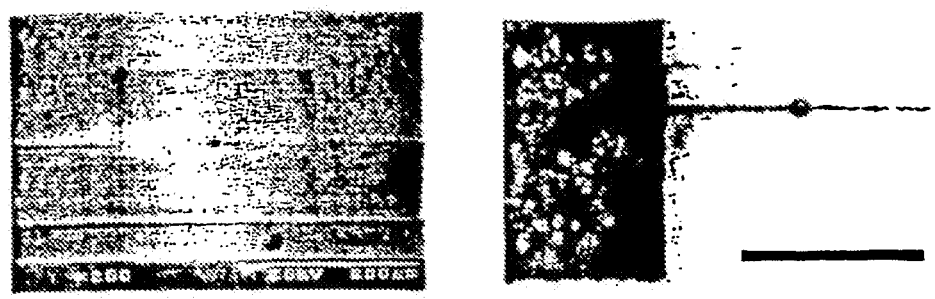
FIG. 16. Examples of a square and a line written and imaged using an SEM.

The reactivity of films with a thickness of ~20 nm was tested in a scanning electron microscope (SEM). Film (i) was shown to be an efficient precursor for continuous metal features. In fact, combinations of squares and lines could be written using the electron beam of the microscope. The unreacted film could be washed away following patterning with dichloromethane to reveal the remaining metal pattern. The structures before and after the washing are shown in FIG. 16. The left image of FIG. 16 shows an example of a square and a line written and imaged using an SEM on F14. The right image shows an example of a part of a square and a line imaged with an SEM after removal of the unexposed film. All the other films showed were inactive with respect to the electron beam patterning.

The same films, cast on a glass substrate, were excited with laser beams in order to test their photochemical activity for metal patterning. On film (i) a series of lines was written using both visible (488 nm, 50 mW, one photon excitation) and infrared (730 nm, 250 mW, two-photon excitation) light. The written pattern was imaged before and after removal of the unreacted nanoparticles by washing. Again Film (i) was shown to be photochemically active in forming metal patterns. Film (ii) was shown to be active as well as, but at higher incident laser power (80 and 400 mW for one- and two-photon excitation, respectively). All the lines were written at a speed of 2 µm/s. Films iii and iv were not photochemically active in patterning metal.

Similar experiments were conducted on films using a the electron beam of a transmission electron microscope (TEM), with films cast on supporting $Si_3N_4$ grids. The solution for film casting was the same as that used for the SEM tests, but were diluted 10 fold in order prepare sub-monolayer films. In some areas of these films, dense regions of particles could be found and in others well separated nanoparticle were observed. In all four films isolated nanoparticles with no neighboring particles showed no significant morphological change during electron beam exposure. Films (iii) and (iv) showed no morphological change even in the regions that were more dense in particles. Films (i) and (ii), in their more dense regions, showed growth of the silver particles and their coalescence to form semi-continuous regions. Film (i) was shown to react quickly under electron irradiation. The reaction was slower in the film (ii).

Figure 17:
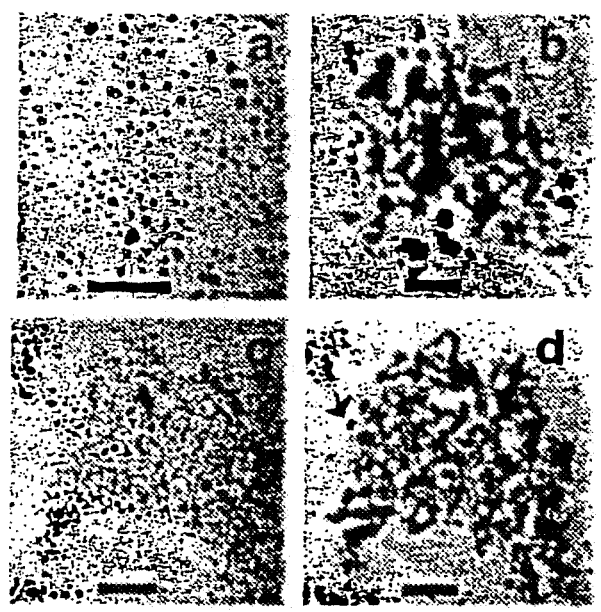
FIG. 17. Laser and electron-beam induced growth of silver nanoparticles in a nanoparticle/salt composite.

The photochemical reactivity was tested on the same set of films cast onto four separate grids. All the films were initially imaged quickly in the TEM, in order to obtain initial reference images, and then they were irradiated with 488 nm light for 240 min. with an intensity of 1.5 $W/cm^2$. The films were then imaged again in the TEM. Only film (i) showed morphological changes. FIG. 17 illustrates the average changes for film (i) after electron-beam and light-induced growth. FIG. 17 illustrates the laser and electron-beam induced growth of silver nanoparticles in a nanoparticle/salt composite. a, TEM image of a composite prior to laser exposure, showing a domain of ordered nanoparticles with a mean radius of 6 nm. b, Image of composite following one-photon excitation at 488 nm for 240 min. with an intensity of 1.5 $W/cm^2$ (to ensure depletion of the silver salt), showing growth of particles. c, Image of composite prior to electron-beam irradiation, showing a domain of ordered nanoparticles with the same mean radius as in a. d, Image of composite following electron-beam irradiation in the TEM instrument for 15 min, showing growth of particles and formation of a nearly consolidated metal domain. Scale bars: 50 nm.

The same set of tests were repeated with films based on nAg10, nAg12 and nAg13 metal particles, and the results were identical to those described above.

Figure 18:
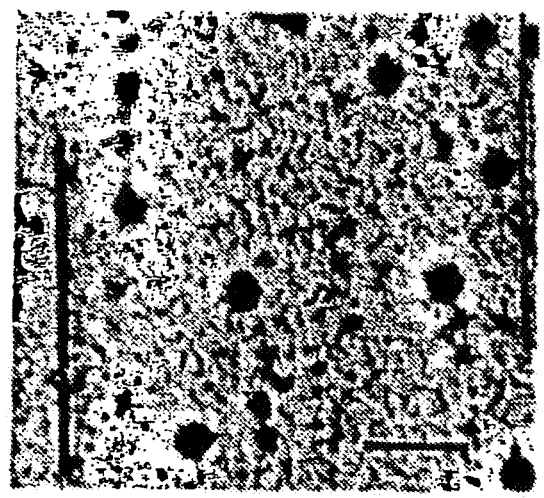
FIG. 18. Transmission optical microscopy of a line written in a PVK film doped with $AgBF_4$ and nAg12.

A thick polyvinylcarbazole (PVK) film (F22) containing nAg12 and a silver salt was cast in order to test whether such a composite material based on the functionalized nanoparticles would function as a precursor for the growth of continuous metal features. The film was mounted on a microfabrication stage and irradiated with 730 nm light (80 mW). It was found that a line of silver could be written and this line was imaged with optical microscopy (FIG. 18). FIG. 18 shows the transmission optical microscopy of a line written in a PVK film (F22) doped with $AgBF_4$ and nAg12. Scale bar 30 µm.

Figure 19:
FIG. 19. Reflection image of a silver square embedded in a polymer nanocomposite.

Growth of Reflective and Conductive Metal Islands and Wires in a Polymeric Matrix Films with compositions described in Examples 39 and 40 were cast on glass slides for two-photon microfabrication. Squares patterns of silver were written using rastered laser scanning. The reflectivity of these squares was probed with a He—Ne laser (632.8 nm). The incident power was 2 mW and the incidence angle was ~30°. The written squares of silver showed a reflectance of 25% whereas the unexposed polymeric composite showed a reflectance of 3%. A reflection image of the square taken using a confocal microscope (514.5 nm) and an interference filter for 514.5 nm which was placed between the scan head and the microscope and which blocks any fluorescence and allows the passage of the reflected light to the detector, is shown in FIG. 19 which illustrates the reflection image of a silver square (right) embedded in a polymer nanocomposite.

Figure 20:
FIG. 20. Schematic drawing of the slide/polymer/microfabricated line configuration used to measure the conductivity of the grown wires.

The conductance of silver lines written on a glass substrate with an array of conductive pads the surface was measured. A series of parallel silver pads were deposited on a glass substrate using standard lithographic techniques. Half the slide was masked to allow subsequent contacting to the pads. A series of 5 parallel lines, 200 µm long with a section of 1 µm², were fabricated at the substrate surface and perpendicular to the pads to make electrical contact between the written lines and the pads. The resistance of lines were measured between pads separated by varying distances. Measurements were also made between control pads that were not connected by written lines. The bias voltage was ramped from −2 V to +2 V, the measured current between the pads not connected by microfabricated lines was in the range of the noise level of the instrument (0.1 pA) indicating a huge resistance. The average resistance measured between two neighboring pads connected by the microfabricated lines (32 µm spacing) was 370Ω. The resistivity (ρ) microfabricated lines was determined to be about $10^{-3}$ Ωcm, without correction for contact resistance (FIG. 20). FIG. 20 is a schematic drawing of the slide/polymer/microfabricated line configuration used to measure the conductivity of the grown wires.

Microfabrication of Copper and Gold Microstructures Via Two-Photon Excitation.

Figure 21:
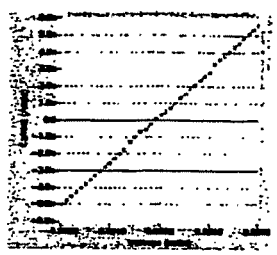
FIG. 21. Plot of an I(V) curve.

Films loaded with copper nanoparticles, copper salts and a dye 1d, as described in Example 41, were cast and a pattern of copper wires was microfabricated using two photon excitation. The same pattern was microfabricated in a gold nanoparticle composite, described in example 41. A 3D "stack of logs" structure was successfully microfabricated in both composites and demonstrates that the methods described herein are general and can be applied to a variety of metals. Both of the structures are shown in FIG. 21 which is a plot of the measured I(V) curve, showing a resistance of 373Ω.

Holographic Data Storage Via Photoinduced Growth of Silver Nanoparticles.

The use of metal nanoparticle containing composite materials for holographic data storage was demonstrated using films described in Example 43. Two laser beams crossing at 90° (see FIG. 22 for the optical set up) were used for holographic exposure. One of the beams (the image) was expanded and passed through a resolution test mask and the other beam served a plane wave reference. The holographic exposure was performed with an $Ar^+$ ion laser (514.5 µm) with a total power of 200 mW. After exposure, the image was reconstructed with a diffraction efficiency of 8% and the reconstructed image was captured using a digital camera (see FIG. 23).

Figure 22:
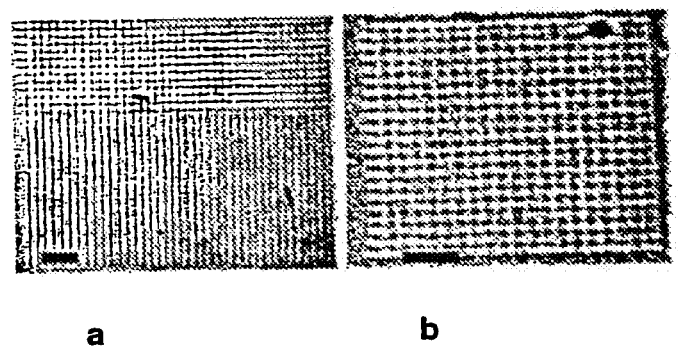
FIG. 22. Metallic structures fabricated in nanocomposites by two-photon scanning laser exposure.

FIG. 22 shows metallic structures fabricated in nanocomposites by two-photon scanning laser exposure a, TOM image of copper microstructure in a different polymer nanocomposite fabricated by two-photon laser exposure. b, TOM image of a gold microstructure fabricated by two-photon laser exposure. Scale bars: 25 µm, scale bars.

Figure 23:
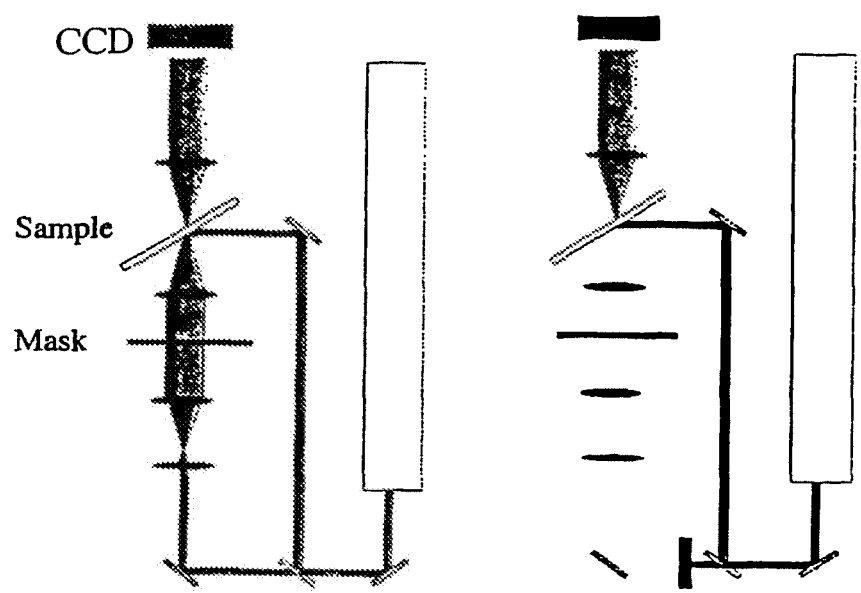
FIG. 23. Optical set ups for the writing and reading of holograms.
Figure 24:
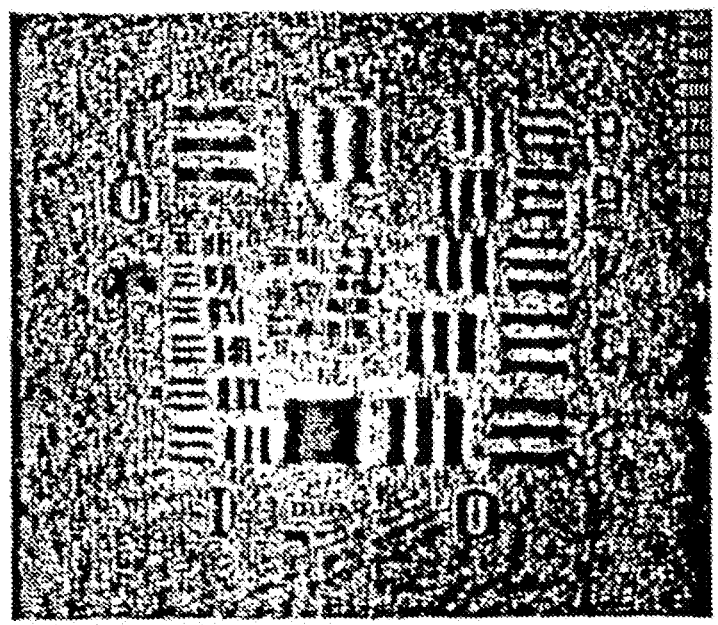
FIG. 24. Reconstructed holographic image.

FIG. 23 shows on the left an optical set up for the writing of holograms. On the right an optical set up for the readings of holograms is shown. The blue ellipsoids represent focusing lenses, while the gray rectangles are mirrors. The faint gray rectangle is a 50/50 beam-splitter. The black rectangle on the right is a beam stop.

Syntheses

All reagents were purchased from Aldrich and used as received. All solvents used are reagent grade unless specified.

Silver Nanoparticles

Silver Nanoparticles Capped with a Single Type of Ligand (nAg1-4)

All the syntheses were done using the following procedure:

340 mg of $AgNO_3$ (2 mmol) were dissolved in 100 ml of absolute ethanol at 0° C. under vigorous stirring. An amount that varied from 2/9 to 2/3 of a millimole of the chosen ligand was dissolved in a small amount of ethanol and added. A saturated ethanol (200 ml) solution of $NaBH_4$ was prepared and, 30 min after the addition of the ligand, was added very slowly (over 2 hours). The solution immediately turned yellow and then slowly became very dark. The solution was left stirring for additional 2 hours and then it was put in a refrigerator to flocculate.

On the next day the solution was vacuum filtered using a quantitative paper filter (VWR) with pore diameter of 1 µm and the filtered powder washed twice with ethanol and various times with acetone.

The yields varied from 49 to 81%.

Example 1

Synthesis of Dodecanethiol-Coated Silver Nanoparticle ($nAg_1$)

330 mg of $AgNO_3$ (~2 mmol) were dissolved in 200 ml of absolute ethanol at 0° C. under vigorous stirring. 58 mg of dodecanethiol (⅔ mmol) were dissolved in 10 ml of ethanol and added to the starting solution. A saturated ethanol (200 ml) solution of $NaBH_4$ was prepared and, 30 min after the addition of the ligand, was added very slowly (2 hours). The solution immediately turned yellow and then slowly became very dark. The solution was left stirring for other 2 hours and then it was put in a refrigerator to flocculate.

On the next day the solution was filtered under vacuum using a quantitative paper filter (VWR) with a pore diameter of 1 µm and the filter powder washed twice with ethanol and various times with acetone.

190.65 mg of a black powder were collected, giving a yield of 71%.

Silver Nanoparticle Coated with Two or More Types of Ligands

The syntheses were done using one of two different strategies. The first strategy a) involved a one step reaction in which nanoparticles are synthesized in the presence of multiple ligands, the second strategy b) involved a two step reaction in which nanoparticle undergo a ligand exchange reaction to introduce a second type of ligand.

a) For the first strategy the following approach was used:

340 mg of $AgNO_3$ (2 mmol) were dissolved in 100 ml of absolute ethanol at 0° C. under vigorous stirring. A 10 ml solution of the desired mixture of ligands was prepared. The molar ratio of the ligands $$\left(\frac{n_{ligandA}}{n_{ligandB}}\right)$$

was between 1 and 0.25 and the total amount was chosen so that the ratio between the moles of ligands and the moles of silver was between 2/9 to 2/3. 30 min after the addition of the ligand, a saturated ethanol (200 ml) solution of $NaBH_4$ was prepared and, was added very slowly (over 2 hours). The solution immediately turned yellow and then slowly became very dark. The solution was left stirring for other 2 hours and then it was put in a refrigerator to flocculate.

On the next day the solution was filtered under vacuum using a quantitative paper filter (VWR) with pore diameter of 1 μm and the filter powder washed twice with ethanol and various time with acetone.

Some types of nanoparticles did not flocculate upon cooling and in those cases the solvent was evaporated under vacuum and then the residue was suspended in water under sonication for 15 min. The water was then left in the hood for 2 h to flocculate and then filtered according to the standard procedure.

The yields varied from 30 to 75%.

Example 2

Synthesis of Octanethiol-Thiol Coated Silver Nanoparticle (nAg6).

340 mg of $AgNO_3$ (2 mmol) were dissolved in 200 ml of absolute ethanol at 0° C. under vigorous stirring. 24 mg of octanethiol (⅙ mmol) were dissolved in 10 ml of ethanol together with 156 mg of $I_4$ (½ mmol) and added to the starting solution. A saturated ethanol (200 ml) solution of $NaBH_4$ was prepared and, 30 min after the addition of the ligands, was added very slowly (2 hours). The solution immediately turned yellow and then slowly became very dark. The solution was left stirring for other 2 hours and then it was put in a refrigerator to flocculate.

On the next day the solution was filtered under vacuum using a quantitative paper filter (VWR) with pore diameter of 1 μm and the filter powder washed twice with ethanol and various time with acetone.

Yield: 273 mg of a black-greenish powder.

b) the second strategy was an exchange reaction

This kind of reaction was done following a known method (Hostetler, M. J., Templeton, A. C. & Murray, R. W. Dynamics of place-exchange reactions on mono layer-protected gold cluster molecules. *Langmuir* 15, 3782-3789 (1999)).

Example 3

Synthesis of Octanethiol-Is Coated Silver Nanoparticle (nAg9).

Ligand exchange reaction on silver nanoparticles nAg1: The silver nanoparticles nAg1 (85.4 mg) coated with octanethiol were dissolved by stirring overnight in $CH_2Cl_2$. Then the ligand $I_8$ (14.2 mg, 0.024 mmol) is added and the dark brown solution is stirred for 5 days in the absence of light. The $CH_2Cl_2$ was removed in vacuum and the brown residue is dispensed in EtOH. The particles set down overnight and can be filtered off with quantitative filterpaper and washed several times with acetone.

Yield: 17 mg. Elemental analysis: nAg9: C, 26.30; H, 4.31; S, 7.38; Ag, 53.99 nAg1: C, 22.85; H, 4.62; S, 7.23; Ag, 62.50

Octanethiol: C, 66.19; H, 11.79; S, 22.07

$I_8$: C, 70.66; H, 6.48; S, 9.81.

Calculation based on the elemental analysis give a weight ratio for the ligands of ca. 85 Octanethiol and 15% TMF-I-48. The calculated molar ratios are:

$$n_{18}/n_{Octanethiol}=0.043$$

$$n_{Ag}/n_{Octanethiol}+n_{18}=1.78 \text{ in nAg9}$$

$$n_{Ag}/n_{Octanethiol}=2.25 \text{ in nAg1}$$

$^1$H NMR ($CDCl_3$): The $^1$H NMR reveals the spectrum of the ligand $I_8$.

Preparation of Gold Nanoparticles

Gold nanoparticles were prepared according to the procedure of Brust (Brust, M., Walker, M., Bethell, D., Schiffrin, D. J. & Whyman, R. Synthesis of Thiol-Derivatized Gold Nanoparticles in a 2-Phase Liquid-Liquid System. *Journal of the Chemical Society-Chemical Communications*, 801-802 (1994)).

Example 4

Synthesis Dodecanethiol-Coated Gold Nanoparticle (nAu1).

352.8 mg of $HAuCl_4*3H_2O$ (0.9 mmol) were dissolved in 30 ml of deionized water, 2.188 g of tetraoctylammoniumbromide (4 mmol) were dissolved in 80 ml of toluene. The two phases were mixed and stirred for 1 h. 170 mg of dodecanethiol (0.84 mmol) were dissolved in 10 ml of toluene and added. After 10 min 380 mg of $NaBH_4$ were dissolved in 25 ml of water and added all at once. Soon the organic layer became black. After 2 h the organic layer was separated and washed 3 times. The toluene was reduced to 10 ml under vacuum and immediately diluted to 500 ml with ethanol and the solution put in a refrigerator overnight. On the next day the solution was filtered on a qualitative filter paper and washed with toluene multiple times.

10 mg of a black powder were collected.

Copper Nanoparticles

Copper Nanoparticle Capped with a Single Type of Ligand 237 mg of $CuBF_4*H_2O$ (1 mmol) were dissolved in 100 ml of absolute ethanol (degassed by argon bubbling for at least an hour) at 0° C. under vigorous stirring in Argon atmosphere. An amount that varied from 2/9 to 2/3 of a millimole of the chosen ligand was dissolved in a small amount of ethanol and added. Solution immediately turned bright yellow. After 2 h a saturated (100 ml) $NaBH_4$ solution of degassed ethanol was prepared and was added very slowly (over 3 hours). The solution immediately turned dark yellow and then slowly became very dark. The solution was left stirring for other 2 hours and then it was put in a refrigerator to flocculate.

On the following day the solution was filtered under vacuum using a quantitative paper filter (VWR) with pore diameter of 1 μm and the filter powder washed twice with ethanol and various times with acetone. The whole reaction was made in controlled atmosphere.

Example 5

Synthesis of Dodecanethiol-Coated Copper Nanoparticle (nCu1).

228 mg of $CuBF_4*H_2O$ (0.96 mmol) were dissolved in 100 ml of absolute ethanol (degassed by argon bubbling for at least 2 h) at 0° C. under vigorous stirring in Argon atmosphere. 51 mg of octanethiol (~⅓ mmol) were dissolved in a small amount of ethanol and added. Solution immediately turned bright yellow. After 2 h a saturated (100 ml) $NaBH_4$ solution of degassed ethanol was prepared and was added very slowly (3 hours). The solution immediately turned yellow and then slowly became very dark. The solution was left stirring for other 2 hours and then it was put in a refrigerator to flocculate.

On the following day the solution was filtered under vacuum using a quantitative paper filter (VWR) with pore diameter of 1 μm and the filter powder washed twice with ethanol and various times with acetone. The whole reaction was made in controlled atmosphere.

The yield was 40 mg of a black powder.

Copper Nanoparticle Coated with Two or More Types of Ligands.

237 mg of $CuBF_4*H_2O$ (1 mmol) were dissolved in 100 ml of absolute ethanol (degassed by argon bubbling for at least an hour) at 0° C. under vigorous stirring in Argon atmosphere. A 10 ml solution of the desired mixture of ligands was prepared and added.

The molar ratio of the ligands

was between 1 and 0.25 and the total amount was chosen so that the ratio between the moles of ligand and the moles of silver was between 2/9 to 2/3. After 2 h a saturated (100 ml) $NaBH_4$ solution of degassed ethanol was prepared and was added very slowly (over 3 hours). The solution immediately turned yellow and then slowly became very dark. The solution was left to for other 2 hours and then it was put in a refrigerator to flocculate.

On the following day the solution was filtered under vacuum using a quantitative paper filter (VWR) with pore diameter of 1 μm and the filter powder washed twice with ethanol and various time with acetone. The whole reaction was made in controlled atmosphere.

Example 6

Synthesis of Octanethiol-Carbazolethiol Coated Copper Nanoparticle (nCu3).

240 mg of $CuBF_4*H_2O$ (0.974 mmol) were dissolved in 100 ml of absolute ethanol (degassed by argon bubbling for at least 2 h) at 0° C. under vigorous stirring in Argon atmosphere. 76 mg of octanethiol (~½ mmol) and 35 mg of dodecanethiol (~⅙ mmol) were dissolved in a small amount of ethanol and added. Solution immediately turned bright yellow. After 2 h a saturated (100 ml) $NaBH_4$ solution of degassed ethanol was prepared and was added very slowly (3 hours). The solution immediately turned yellow and then slowly became very dark. The solution was left to for other 2 hours and then it was put in a refrigerator to flocculate.

On the following day the solution was filtered under vacuum using a quantitative paper filter (VWR) with pore diameter of 1 μm and the filter powder washed twice with ethanol and various time with acetone. The whole reaction was made in controlled atmosphere.

The yield was 45 mg of a black powder.

Dye and Ligand Syntheses

Most of the molecules and polymers used in the Examples were prepared according to literature methods, the synthesis of the new molecules is described here:

$I_9$

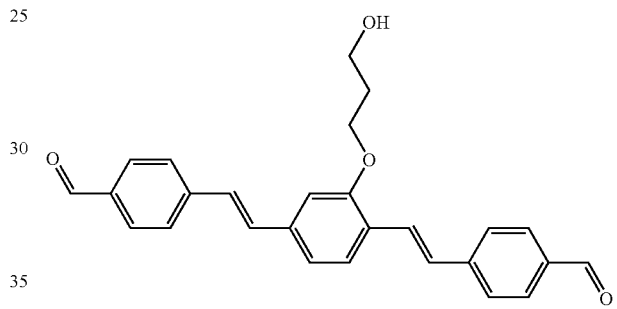

$C_{27}H_{24}O_4$

Exact Mass: 412.17

Mol. Wt.: 412.48

C, 78.62; H, 5.86; O, 15.52

4-{2-[4-[2-(4-formylphenyl)vinyl]-2-(3-hydroxypropoxy)phenyl]vinyl}benzaldehyde (TMF-1-39): A solution of mono(diethyl)acetal terephthalaldehyde (1.75 ml, 8.8 mmol) and diethyl 2-(3-{[tert-butyl(dimethyl)silyl]oxy}-propoxy)-4-[(diethoxyphosphoryl)methyl]benzyl phosphonate (2.49 g, 4.4 mmol) in tetra hydrofuran (THF) (100 ml) was cooled to 0° C. with an ice bath. $K_2CO_3$ (10 ml 1 M solution in THF, 10 mmol)) was added slowly via a syringe and reaction is allowed to warm up to room temperature. After stirring overnight water was added followed by 1 M HCl (50 ml) and the reaction mixture was stirred for another hour. The product was extracted with $CH_2Cl_2$ and chromatographed on silica. The first fraction eluted with $CH_2Cl_2$ was rejected and the product was then collected using ethylacetate as solvent. Crystallization from $CH_2Cl_2$ gave the pure product as yellow solid (663 g).

$^1$H NMR (CDCl$_3$): 10.01 (1H, s), 10.00 (1H, s), 7.88 (4H, t, J=7.5 Hz), 7.67 (4H, t, J=7.5 Hz), 7.60-7.64 (3H, m), 7.12-7.24 (4H, m), 4.30 (2H, t, J=6.0 Hz), 3.97 (2H, t, J=6.0 Hz), 2.20 (2H, tt, J=6.0, 6.0 Hz), 1.61 (1H, br s) ppm; element. anal.: calcd. C: 78.62; H, 5.86; found C, 78.36; H, 5.67.

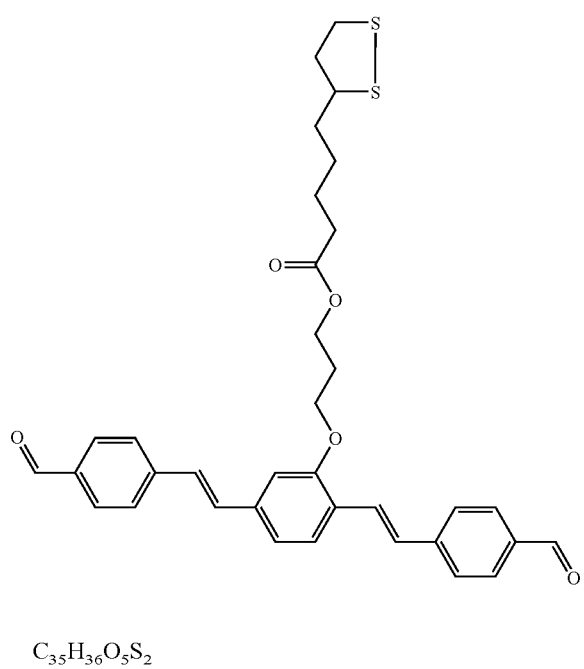

C$_{35}$H$_{36}$O$_5$S$_2$
Exact Mass: 600.20
Mol. Wt.: 600.79
C, 69.97; H, 6.04; O, 13.32; S, 10.67

3-{2,5-bis[(E)-2(4-formylphenyl)ethenyl]phenoxy}-propyl 5-(1,2-dithiolan-3-yl) pentanoate:

A solution of 4-{2-[4-[2-(4-formylphenyl)vinyl]-2-(3-hydroxypropoxy)phenyl]vinyl}-benzaldehyde (above) (200 mg, 0.49 mmol), lipoic acid (100 mg, 0.49 mmol) and p-toluenesulfonic acid (20 mg, 0.10 mmol) was refluxed overnight in the minimum amount of CH$_2$Cl$_2$ ($\approx$20 ml) necessary to dissolve the chromophore. The reaction mixture was poured onto a column (Al$_2$O$_3$/CH$_2$Cl$_2$) and flash chromatographed with CH$_2$Cl$_2$:Ethylacetate/10:1. The starting material was recovered using ethyl alcohol (EtOH). Yield: 90 mg (31%) yellow solid.

$^1$H NMR (CDCl$_3$): 9.974 (1H, s, CHO), 9.969 (1H, s, CHO), 7.86 (2H, d, J=8.5 Hz), 7.85 (2H, d, J=8.5 Hz), 7.65 (4H, d, J=8.0 Hz), 7.57-7.62 (2H, m), 7.04-7.24 (5H, m), 4.36 (2H, t, J=6.5 Hz), 4.19 (2H, t, J=6.0 Hz), 3.49 (1H, m), 3.12 (1H, m), 3.05 (1H, m), 2.39 (1H, m), 2.31 (2H, t, J=7.0 Hz), 2.25 (2H, m), 1.84 (1H, m), 1.57-1.69 (4H, m), 1.35-1.48 (2H, m)ppm. $^{13}$C NMR (CDC$_3$1): 191.86 (CHO), 191.77 (CHO), 173.65, 156.78, 144.08, 143.28, 138.09, 135.60, 135.38, 131.86, 130.47, 128.27, 128.00, 127.36, 127.16, 126.52, 126.30, 120.16, 110.30, 65.19, 61.33, 56.52, 40.42, 38.66, 34.76, 34.21, 29.89, 28.94, 24.85 ppm.

Polymer Synthesis (a2)

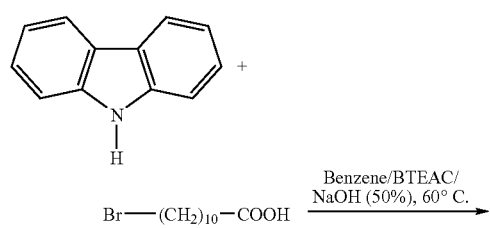

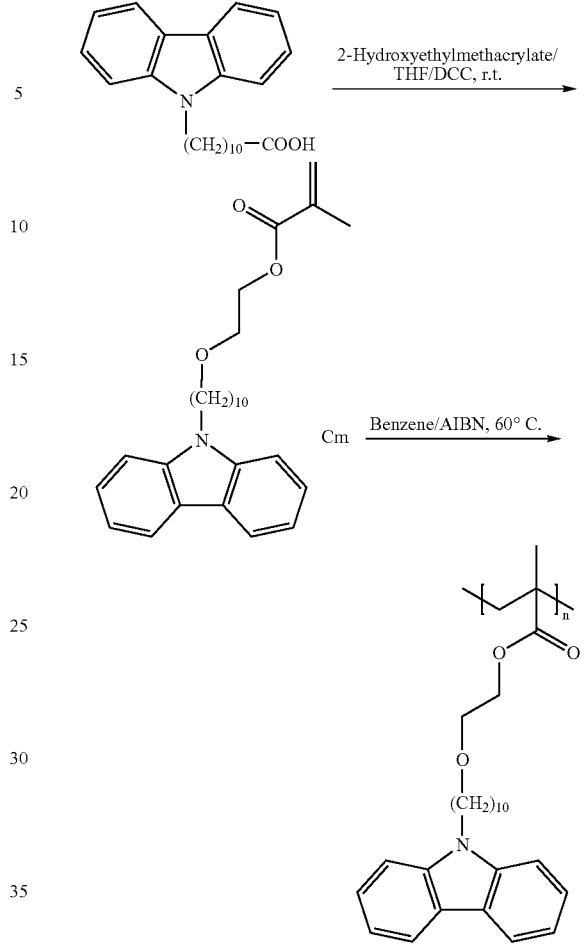

BTEAC = Benzyltriethylammonium chloride
DCC = 1,3-Dicyclohexylcarbodiimide
AIBN = 2,2'-Azobisisobutyronitrile Synthesis of Carbazole Monomer c$_m$:

To a solution of carbazole acid (5.0 g, 14.23 mmol) and 2 hydroxyethylmethacrylate (2.0 g, 15.37 mmol) and 4-dimethylamino-pyridine (0.2 g) in THF (30 ml) was added DCC (3.7 g, 17.96 mmol) at room temperature. The reaction was carried out at this temperature for 10 h. Solid was removed by filtration. After removal of THF, the crude product was purified by silica gel column using hexane/ethyl acetate (9:1) as eluent. The pure product as colorless oil was obtained in 4.2 g (63.6%).

$^1$H-NMR (CDCl$_3$, TMS, 500 MHZ): δ=8.12 (d, 2 H$_{arom}$, J=7.5 Hz), 7.47 9m, 2 H$_{arom}$) 7.42 (d, 2 H$_{arom}$, J=7.5 Hz), 7.24 (m, 2 H$_{arom}$), 6.13 (s, 1 H, C=C—H), 5.60 (s, 1 H, C=C—H), 4.35 (m, 4 H, 2×OCH$_2$), 4.30 (t, 2 H, NCH$_2$, J=7.5 Hz), 2.33 (t, 2 H, COCH$_2$, J=7.0 Hz), 1.95 (s, 3H, CH$_3$), 1.88 (m, 2 H, CH$_2$), 1.61 (m, 2 H, CH$_2$), 1.24 (m, 12 H, 6×CH$_2$)ppm. $^{13}$C-NMR (CDCl$_3$, 126 MHZ): δ=173.58, 167.07, 140.34, 135.87, 126.02, 125.51, 122.73, 120.29, 118.63, 108.59, 62.42, 61.82, 43.01, 34.09, 29.38, 29.35, 29.30, 29.14, 29.00, 28.92, 27.26, 24.84, 18.25 ppm.

Elemental Analysis for C$_{29}$H$_{37}$NO$_4$ (463.61): Cald: C, 75.13; H, 8.04; N, 3.02. Found: C, 75.08; H, 7.83; N, 3.28.

Synthesis of Carbazole Polymer PCUEMA:

Carbazole monomer (2.7 g, 5.82 mmol) and AIBN (14.3 mg, 0.087 mmol) were dissolved in dry benzene (5.0 ml) under nitrogen. The reaction mixture was cooled with liquid nitrogen. After one freeze-thaw-pump cycle the reaction was heated at 60° C. for 60 h. The polymer was precipitated in methanol and collected by filtration. The polymer was dissolved in THF solution and precipitated in methanol. The dissolution/precipitation/filtration sequence was repeated twice. After drying, the white polymer was obtained in 2.65 g (98.1%) yield.

$^1$H-NMR (CDCL$_3$, TMS. 500 MHZ): δ=7.97 (d, 2 H$_{arom}$, J=8.0 Hz), 7.31 (m, 2 H$_{arom}$, 7.24 (d, 2 H$_{arom}$, J=8.0 Hz), 7.09 (m, 2 H$_{arom}$), 4.07 (m, 4 H, 2×OCH$_2$), 4.01 (s, br, 2 H, NCH$_2$), 2.17 (s, br, 2 H, COCH$_2$), 1.68 (m, 2H, CH$_2$), 1.45 (s, br, 2 H, CH$_2$), 1.07 (m, 12 H, 6×CH$_2$), 0.93 (s, br, 2 H, CH$_2$), 0.80 (s, br, 3 H, CH$_3$) ppm. $^{13}$C-NMR (CDCl$_3$, 126 MHZ): δ=173.25, 140.30, 128.30, 125.48, 122.70, 120.26, 118.63, 108.56, 62.65, 61.16, 44.82, 42.89, 33.78, 29.44, 29.35, 29.28, 29.08, 28.90, 27.22, 24.74 ppm.

I$_4$ and I$_5$

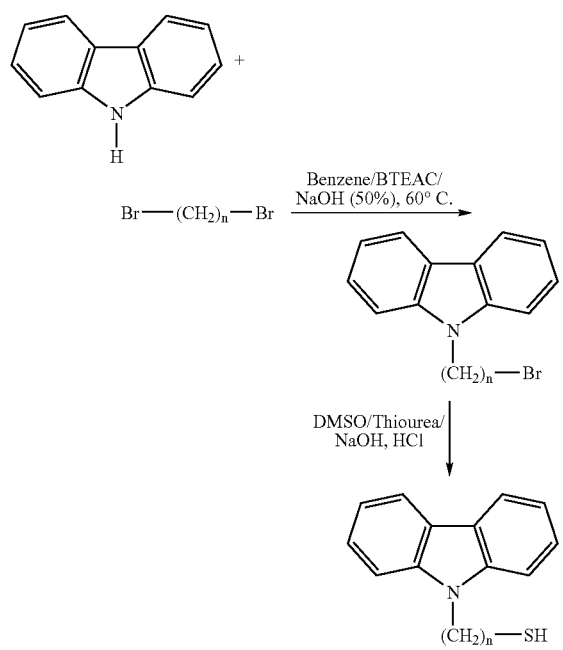

Example 7

Synthesis of Ligand I$_4$ 3.57 g 9-carbazole-yl-octane-1-thiol (~10 mmol) were dissolved in 20 ml of dimethylsulfoxide (DMSO), 1.52 mg of thiourea (~20 mmol) were added, the solution was vigorously stirred. After 2 days a concentrated aqueous solution of NaOH was added dropwise. Soon a red precipitated formed, during the addition the precipitated redissolved again and solution turned red. Addition was stopped upon reaching of pH 11 (checked using pH paper). The solution was then neutralized adding dropwise HCl (aq. conc) and it slowly turned yellow. The organic was then extracted with diethyl ether (Et$_2$O) and washed with water three times. The organic solvent was dried under vacuum, and the residue was collected.

Sample Preparation

In this section several examples of nanocomposite sample processing and preparation are given. All films hereafter reported have been tested and metallic silver lines have been successfully written using radiation in all cases on.

Samples were prepared by solvent casting or by spin coating, Most of the samples were cast in air atmosphere, in some cases the processing was done under argon atmosphere.

All glass microscope slides were cleaned with the following procedure:

a) Sonication for 1 h in water and soap and extensive rinse with DI water b) Sonication for 1 h in spectroscopic grade methanol and rinse with absolute ethanol or isopropanol.

Glass slides with monolayer coatings of nanoparticles were processed after cleaning as follows (hereafter referred as monolayered slides):

a) Dipped for 10 min in a saturated isopropanol (reagent) solution of KOH, and then rinsed with DI water and dried using a nitrogen flow.

b) A solution of 75 ml of toluene, 0.5 ml of isopropylamide and 2 ml of 2-mercaptopropyltrimethylsiloxane was prepared and kept at 60° C. for an hour.

c) the slides were dipped in the solution for 1 h at 60° C., and then rinsed with hexane (spectrophotometric grade).

d) The samples were immersed overnight in hexane.

e) A CH$_2$Cl$_2$ solution (2 mg/ml of nanoparticle nAg6) was solvent casted by solvent evaporation on the slides f) The samples were immersed overnight in hexane.

ITO (Indium Tin Oxide) slides were cleaned simply by rinsing them in ethanol on them.

Nanocomposite Film Casting By Solvent Evaporation

A fixture for hold samples for casting by solvent evaporation was fabricated and used for all such castings this plate held substrates fixed in a horizontal position and allowed for control of the atmosphere. Under each slide 3 ml of reagent grade chloroform were placed prior to casting so to initially maintain the saturation of the atmosphere with solvent vapor upon introduction of the casting syrup. Each slide compartment was closed using a watch glass, so that the volume of air in which each slide was casted was approx. 15 cm$^3$.

Solvents were degassed by freeze-pump-thaw cycle.

Example 8

FI Standard 100 μm Film 188.86 mg of polymer a$_1$ (poly 9-vinylcarbazole), 89.6 mg of ethylcarbazole, 2.59 mg of nAg6, and 8.77 mg of dye 1d were dissolved in 6 ml of degassed chloroform under argon atmosphere and left stirring overnight.

On the following day 22 mg of AgBF$_4$ were dissolved in 0.02 ml of degassed acetonitrile and mixed to the chloroform solution. After 30 min the solution was filtered with a membrane filter (1 μm pore size). 0.6 ml of the filtered solution were casted on a 25×25 mm ITO slide.

Example 9

F2 Standard 100 μm Film 660 mg of polymer a$_1$ (poly 9-vinylcarbazole), 329 mg of ethylcarbazole, 2.8 mg of nAg6, and 28 mg of dye 1d were dissolved in 6 ml of degassed chloroform under argon atmosphere and left stirring overnight.

On the following day 110 mg of AgBF$_4$ were dissolved in 0.33 ml of degassed acetonitrile and 0.3 ml of those were added to the chloroform solution. After 10 min the solution was filtered with a membrane filter (1 μm pore size). 2 ml of the filtered solution were casted on a 75×25 mm glass slide.

Example 10

F3 20 µm Film with High Loading of Nanoparticles 92 mg of polymer $a_1$ (poly 9-vinylcarbazole) were dissolved in 5 ml of dichloromethane (DCM), 12 mg of $AgBF_4$ were dissolved in 5 ml of DCM and 1 ml of acetonitrile, 5 mg of dye 1d were dissolved in 5 ml of DCM, 5.5 mg of nAg1 were dissolved in 2 ml of chloroform. All solution were stirred for 2 h and then mixed together. 2 ml of the solution were carted on a 75×25 mm glass slide.

Example 11

F4 Films for TEM 11.5 mg of polymer $a_1$ holy 9-vinylcarbazole), 2.4 mg of $AgBF_4$, 2.8 mg of dye 1d, 1 mg of nAg1 were dissolved in 10 ml of DCM; solution was diluted 10 times and 2 µl of this solution were carted on a carbon coated copper grid. Three identical films were made in this way.

FIG. 9 shows TEM images illustrating growth of metal nanoparticle in a composite film upon exposure to either one or three laser pulses from a ns pulsed laser. The upper TEM image shows the system after one laser shot, the lower after three. In the upper limit the average radius has become 4.9 nm, in the non-irradiate sample it was 2.9. In the lower image the average diameter is even bigger and larger metal islands can be seen.

Example 12

F5 Standard 100 µm Film with a Different Kind of Nanoparticle 648 mg of polymer $a_1$ (poly 9-vinylcarbazole), 316 mg of ethylcarbazole, 2.75 mg of nAg7, and 20.7 mg of dye 1d were dissolved in 6 ml of degassed chloroform under argon atmosphere and left stirring overnight.

On the following day 219 mg of $AgBF_4$ were dissolved in 0.6 ml of degassed acetonitrile and 0.2 ml were mixed to the chloroform solution. After 30 min the solution was filtered with a membrane filter (1 µm pore size). 0.4 ml of the filtered solution were carted on a 25×25 mm ITO slide.

Example 13

F6 Standard 10 µm Film 64.5 mg of polymer $a_1$ (poly 9-vinylcarbazole), 38.1 mg of ethylcarbazole, 1.21 mg of nAg6, and 3.31 mg of dye 1d were dissolved in 6 ml of degassed chloroform under argon atmosphere and left stirring overnight.

On the following day 20.4 mg of $AgBF_4$ were dissolved in 0.3 ml of degassed acetonitrile and 0.1 ml were mixed to the chloroform solution. After 30 min the solution was filtered with a membrane filter (1 µm pores). 0.4 ml of the filtered solution were casted on a 75×25 mm glass slide.

Example 14

F7 Standard 100 µm Film with a Different Dye 411.16 mg of polymer $a_1$ (poly 9-vinylcarbazole), 206.48 mg of ethylcarbazole, 2.28 mg of nAg6, and 19.72 mg of dye 2b were dissolved in 6 ml of degassed chloroform under argon atmosphere and left stirring overnight.

On the following day 50.8 mg of $AgBF_4$ were dissolved in 0.3 ml of degassed acetonitrile and mixed to the chloroform solution. After 30 min the solution was filtered with a membrane filter (1 µm pores). 0.6 ml of the filtered solution were casted on a 75×25 mm monolayered glass slide.

Example 15

F8 Standard 100 µm Film with a Different Polymer 95.1 mg of polymer $a_2$ (PCUEMA), 0.71 mg of nAg6, and 1.8 mg of dye 1d were dissolved in 1 ml of degassed chloroform under argon atmosphere and left stirring overnight.

On the following day 9.5 mg of $AgBF_4$ were dissolved in 0.05 ml of degassed acetonitrile and mixed to the chloroform solution. After 30 min the solution was filtered with a membrane filter (1 µm pores). 0.6 ml of the filtered solution were casted on a 25×25 mm monolayered glass slide.

Example 16

F9 Standard 100 µm Film for Copper Generation 66.6 mg of polymer $a_4$ (poly methylmethacrylate), 1.1 mg of nCu1, and 3.08 mg of dye 1d were dissolved in 0.6 ml of degassed chloroform under argon atmosphere and left stirring overnight.

On the following day 5 mg of $ICuP(CH_3)_3$ were dissolved in 0.05 ml of degassed acetonitrile and mixed to the chloroform solution. After 30 min the solution casted on a 25×25 mm glass slide Spin Coated Films

Example 17

F10 Standard Spin Coated Film 100 mg of polymer $a_1$ (poly 9-vinylcarbazole), 6 mg of ethylcarbazole, 3 mg of nAg4, and 4.5 mg of dye 1d were dissolved in 1 ml of chloroform and left stirring overnight.

On the following day 100 mg of $AgBF_4$ were dissolved in 1 ml of acetonitrile and 0.1 ml were added to the chloroform solution. After 30 min the solution was spin coated on a 25×25 mm glass slide at 2000 RPM for 20s. The obtained thickness was ~8 µm, as proved by prism coupler measurements.

Nanoparticle Containing Viscous Liquid

Example 18

F11 Standard Viscous Liquid Matrix Film

A quantity of host $c_1$ was heated using an heatgun and as soon as it flowed freely it was pipetted in a vial into order to weigh a fixed amount.

226 mg of host $c_1$, 2 mg of nAg6, and 5.77 mg of dye 1d were dissolved in 2 ml of chloroform and left stirring overnight.

On the following day 11 mg of $AgBF_4$ were dissolved in 0.1 ml of acetonitrile and mixed to the chloroform solution. After 30 min the solution was casted on a 75×25 mm glass slide.

Class I Films

Example 19

F12 Standard Class I Film 5.23 mg of nAg1, and 0.5 mg of dye 1d, and 0.5 mg of $AgBF_4$ were dissolved in 2 ml of chloroform left stirring overnight.

On the following day the solution was casted on a 75×25 mm glass slide.

Figure 10:
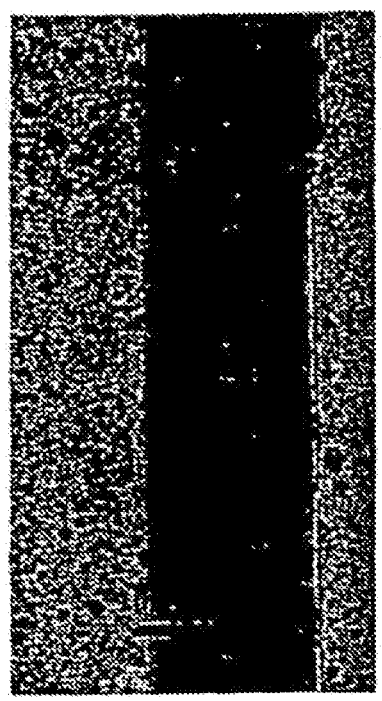
FIG. 10. Silver ribbon written with a two-photon irradiation.

FIG. 10 shows a silver ribbon written with a two-photon irradiation (800 nm, 120 fs) (Example 19).

Metal Writing in Nanoparticle Composites Using One and Two Photon Excitation

All writing experiments were performed using a femtosecond mode-locked Ti:sapphire laser. Specifically a Spectra Physics system consisting of a Tsunami (Ti:sapphire laser) pumped by a Millenia (diodes pumped YAG laser) was used. The average pulse length was 120 fs with a bandwidth of ~20 nm. Unless specified otherwise the wavelength used was 760 nm.

The sample was mounted on a micropositioner (Sutter MP-285). The laser beam was focused on the sample using an inverted microscope (Nikon). A computer controlled both the micropositioner and a shutter (Newport 846HP). The combination of the micropositioner movements and the opening/closing cycles of the shutter allowed patterned exposures and metallic structures to be written in the sample.

In order to locate the focus of the beam in the sample a two-photon microscopy setup was used, the beam was going through a Biorad MRC-1024 scanhead.

Writing Using Single Photon Excitation

In the case of writing using single photon excitation, the laser output light was frequency doubled double using a LBO doubling crystal and the remaining fundamental light left was filtered away using a combination of a crystal polarizer and an infrared short pass dielectric filter.

The rest of the set-up was identical to the twp-photon writing process, above described. The focusing process was done using the scanhead in a confocal fashion.

Example 20

Threshold Measurements for One-Photon Writing of Silver

Film F1 (Example 8) was mounted on the micropositioner, in the standard way. The laser output wavelength was set at 860 nm (420 mW) and was not changed during the experiment. A filter wheel was placed in the set up so to be able to make continuous and controllable variations in the average power of the laser. The stage translation speed was set at 10 μm/s. The beam was focused in the sample using a 60× objective (NA 1.4). It was possible to write lines in the film everywhere and the behavior was mostly uniform: so for a comparison with the two-photon experiment the threshold was calculated at the glass/film interface. The power was gradually decreased and the success of the writing process was determined by optical microscopy. The writing threshold was found to be 0.09 mW. If we make the hypothesis of a circular beamspot with a diameter of 1 μm, we find a threshold intensity of approx. $10^8$ W/m² for these 120 fs pulses.

For a pattern of lines written spaced of 5 μm we were able to put an upper limit to their width using the optical images, this limit being 500 nm.

Figure 11:
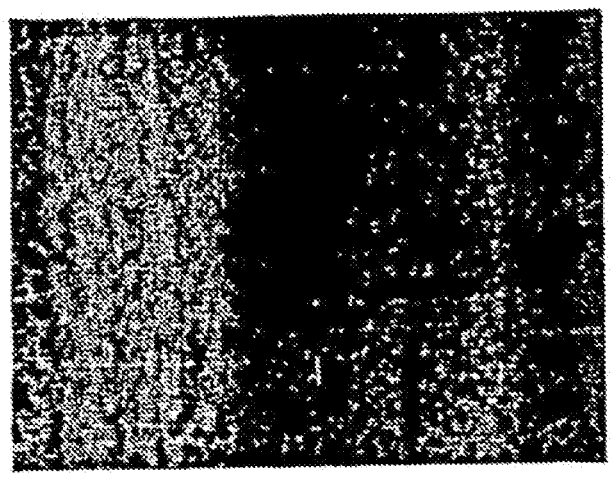
FIG. 11. Silver lines written using a one-photon excitation.

FIG. 11 shows silver lines written using a one-photon excitation (430 nm), lines are clearly visible. The dark spots are defects in the film which was not of optimal quality.

Writing Using Two-Photon Excitation.

Dye utilized herein as two-photon excitable photoreducing agents were known to have a reasonably large two-photon cross-section thus allowing efficient two-photon excitation. This in combination with a high NA focusing system, allows writing high resolution lines in three-dimensional patterns in the matrix.

Example 21

Threshold Measurements for Two-Photon Writing of Silver

Film F1 (Example 8) was mounted on the micropositioner, in the standard way. The laser output wavelength was set at 760 nm (620 mW) and was not changed during the experiment. A filter wheel was placed in the set up so to be able to make continuous and controllable variations in the average power of the laser. The stage translation speed was set at 10 μm/s. The beam was focused in the sample using a 60× objective (NA 1.4). Lines were written everywhere in the film the behavior was mostly uniform, so to have the possibility to further develop the structures the threshold was calculated at the glass/film interface. The power was gradually decreased and the success of the writing process was determined by optical microscopy. The writing threshold was found to be 1.55 mW. If we make the hypothesis of a circular beamspot with a diameter of 1 μm, we find an intensity threshold of approx. $1.5 \cdot 10^9$ W/m².

For a pattern of lines written spaced of 5 μm we were able to put an upper limit to their width using the optical images, this limit being 1 μm.

Example 22

Multiphoton Writing and Developing

Film F3 (Example 10) was mounted on the micropositioner, in the standard way. The laser output wavelength was set at 800 nm (400 mW) and was not changed during the experiment. The writing speed was set at 100 gm/s. The microscope objective used was a 10×. Lines were written at the glass/film interface. A regular pattern of 6 sets of 5 lines each was written. Each set was places 30 μm away from the previous and the lines were spaced 10 mm away to each other, all the lines were 500 μm long. After writing the film was placed in a DCM containing beaker and left there for 3 days. In doing these the polymer was washed away and the lines stayed on the substrate.

Example 23

Multiphoton Writing and Developing

Film F2 (Example 9) was mounted on the micropositioner, in the standard way. The laser output wavelength was set at 760 nm (620 mW) and was not changed during the experiment. The stage translation speed was set at 10 μm/s. The beam was focused in the sample using a 60× objective (NA 1.4) and an immersion oil was used. Lines were written everywhere in the film the behavior was mostly uniform. Many different patterns were written, the most significant one being a cage "like" structure with a 13 layer of sets of lines each layer being 5 μm higher than the previous, each layer consisting of 20 lines 100 μm long and spaced of 5 μm, each layer consisting of lines perpendicular to the ones of the previous layer.

After the writing process was done the film was removed from the micropositioner, cleaned from the immersion oil using a paper tissue and then put in a solution of DCM and acetonitrile (10:1). The polymer dissolved away leaving the structure on the substrate.

Figure 4:
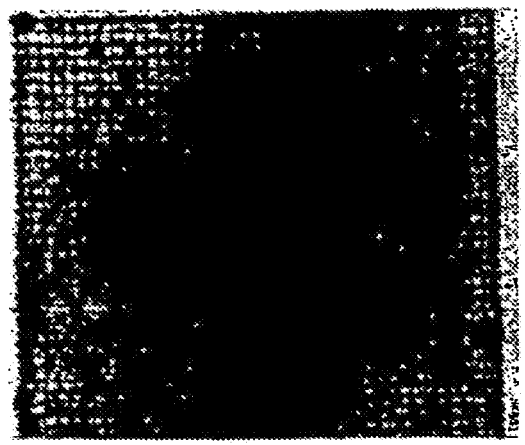
FIG. 4. Optical transmission image, (top view) of a 3D structure (200×200×65 µm) written in a polymer matrix.

FIG. 4 illustrates an optical transmission image, (top view) of a 3D structure (200×200×65 μm) written in a polymer $a_1$ matrix. The writing process was done using a two-photon excitation (760 nm, 120 fs).

Figure 5:
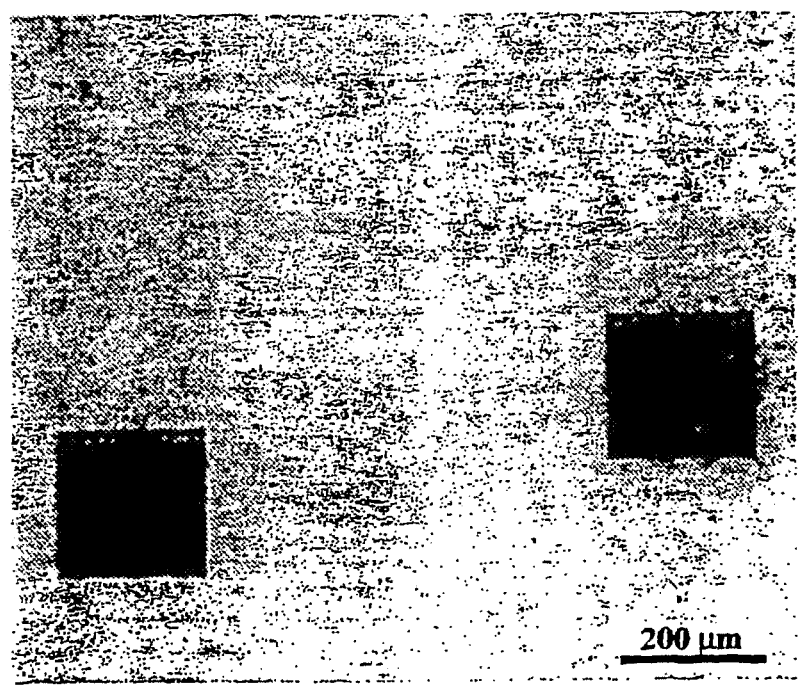
FIG. 5. Optical image of the same structure shown in FIG. 4 on a larger scale.

FIG. 5 illustrates an optical image of the same structure shown in FIG. 4 on a larger scale, the optical quality of the matrix is clearly quite good.

Figure 6:
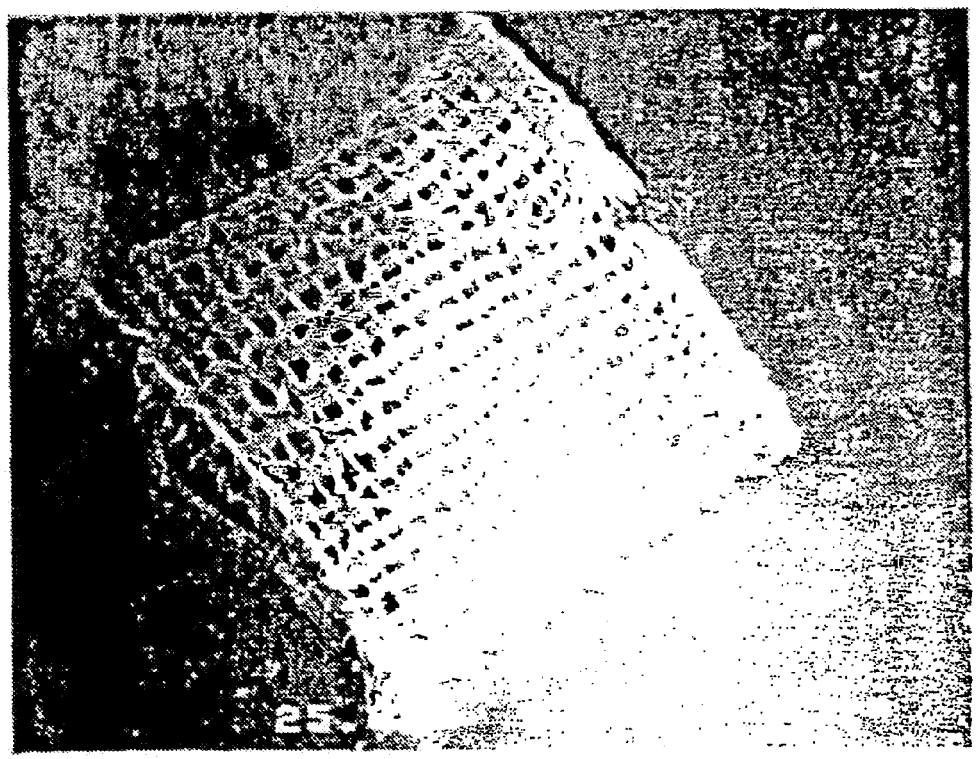
FIG. 6. SEM image of a 3D metallic silver microstructure formed by two-photon writing in a composite film FIG. 7. XPS spectrum and image of a set of silver lines.

FIG. 6 is a SEM image of a 3D metallic silver microstructure formed by two-photon writing in a composite film, they revealed by washing to produce a free standing structure on the surface.

Example 24

Multiphoton Writing of Copper Structures

Film F9 (Example 16) was mounted on the micropositioner, in the standard way. The laser output wavelength was set at 760 nm (620 mW) and was not changed during the experiment A square of copper was written using the a 10× lens. The result was checked via optical imaging.

Figure 12:
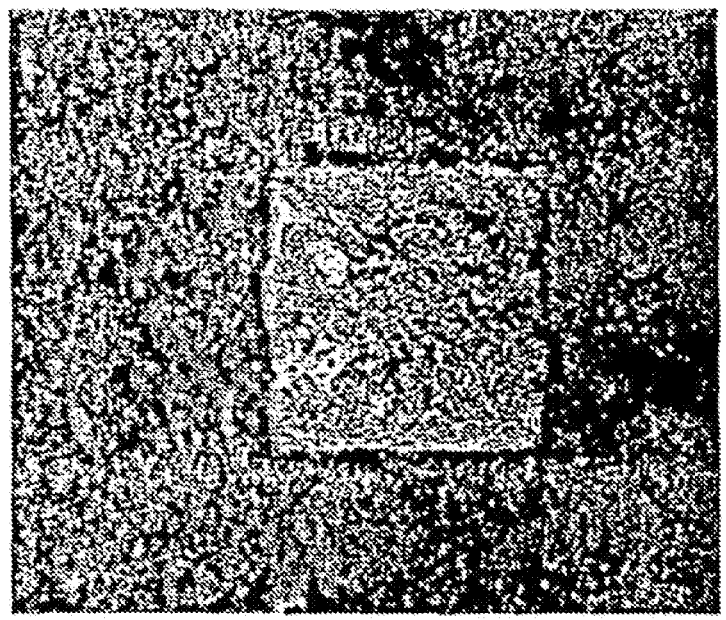
FIG. 12. Optical micrograph of a copper square written by two-photon excitation.

FIG. 12 shows an optical micrograph of a copper square (200×200 μm) written by two-photon excitation.

Example 25

Control Experiment, F13

10 mg of PVK where dissolved in 10 ml of dichloromethane, 1 mg of $AgBF_4$ was dissolved in the same solution, 1 mg of dye 1 was then added. The solution was casted on a 75×25 mm glass slide.

The film was put in a UV chamber and irradiated at 419 nm with 15 lamps (5 W each). The optical absorption was followed and the results are summarized in FIG. 13, just the bleaching of the nanoparticle band was observed.

Figure 13:
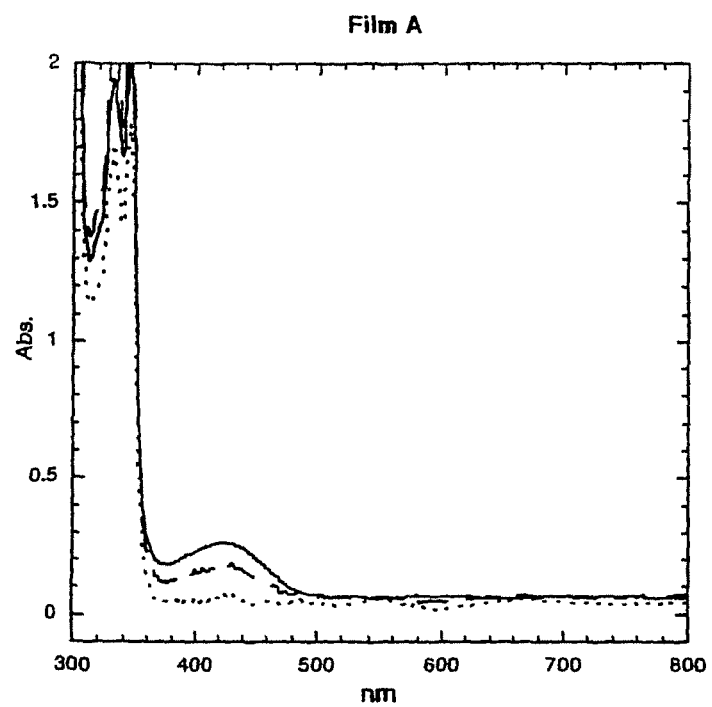
FIG. 13. Spectrum of sample from control experiment.

FIG. 13 shows a spectrum of the sample from control experiment showing the absence of formation of metal nanoparticle in a film containing dyes and metal salt but no initial concentration of metal nanoparticle. Note the absence of the absorption band of metal nanoparticles following exposure. The solid line represent the spectrum of the film 13, the bands around 300 nm are due to the polymer itself while the band at 426 is characteristic of dye 1. The dashed line represents the same film irradiated for 30 min while the dotted one for 60 min.

Characterization

XPS

Metallic Silver lines written according to the procedures described above (Example 22) were analyzed using XPS spectroscopy and their Auger Parameter was measured to be 726.2 meV, perfectly matching the tabulated one for $Ag^0$. Images of the written lines could be recorded using the spectrometer in an imaging mode.

Figure 7:
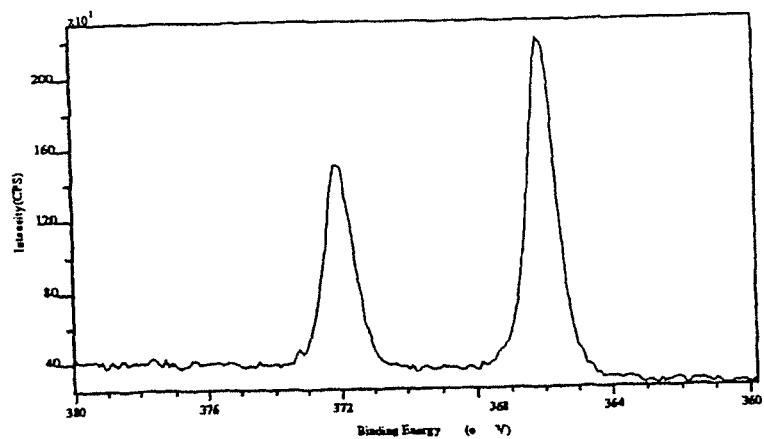
Figure 7:
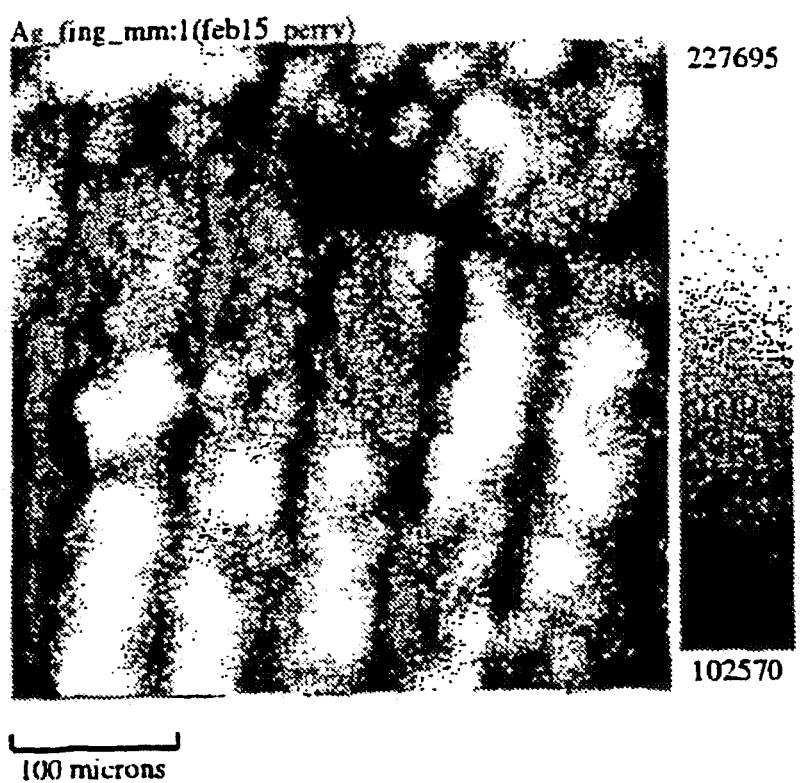

FIG. 7 shows a XPS spectrum (above) and image (below) a set of silver lines. The Auger parameter obtained from the spectrum is 726.2, which is the same as that tabulated one for zerovalent silver.

SEM

Figure 14:
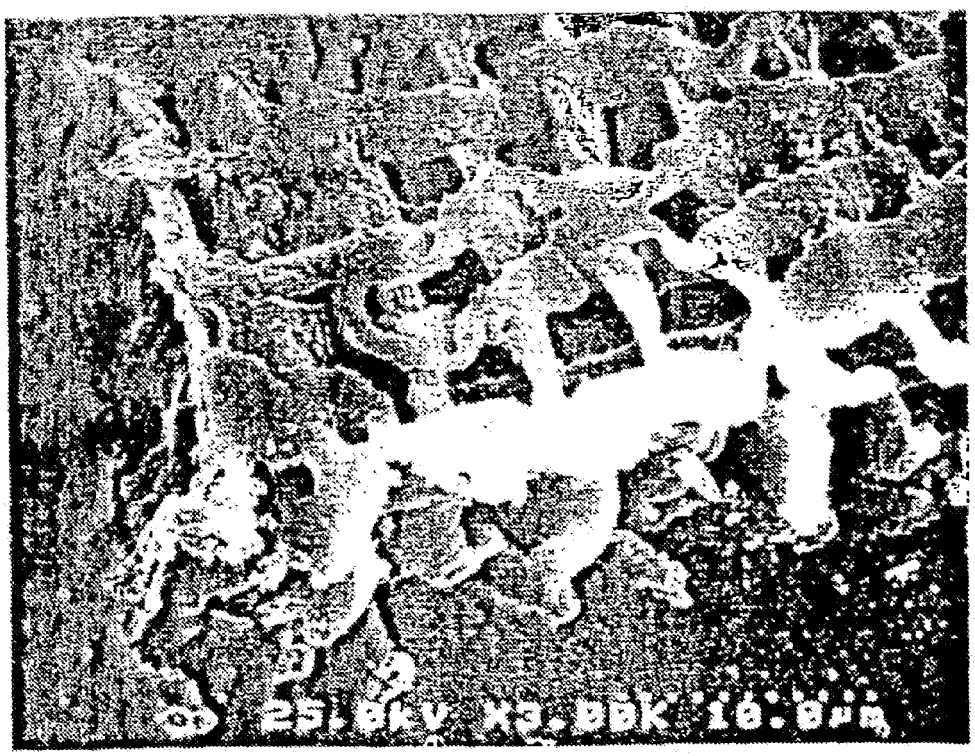
FIG. 14. SEM picture of the corner of a 3D metallic silver structure written using two-photon excitation.

The structures were coated with a very thin metallic layer (Au/Ir alloy) for SEM imaging. FIG. 14 shows an SEM picture of the corner of a 3D metallic silver structure written using two-photon excitation. The multiple layers written are evident.

TEM Characterization of Metal Nanoparticle Growth.

A nanosecond YAG laser (20 Hz) doubled light (532 nm) was used in single shot fashion for the following experiment. One of the amorphous carbon coated copper grid with the composite film on it (estimated thickness 50 nm) was not used and left as a reference, the second one received a single laser pulse, the third one received three laser pulses. The average energy of each pulse was 120 μJ. The average radius of the particle in the reference grid was found to be 2.95 nm; in the second grid it was 4.95 nm, in the third grid it was found to be approx. 9.5 nm. Moreover the number of nanoparticle per unit area was found not to increase.

Figure 15:
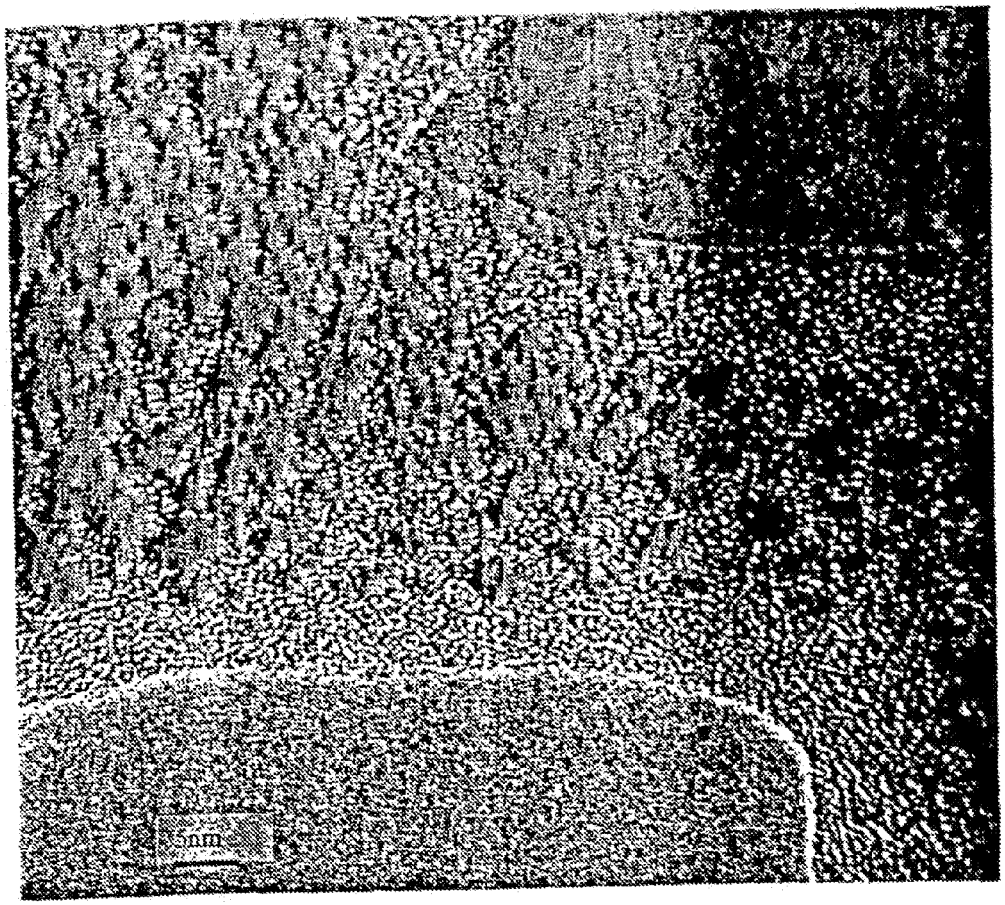
FIG. 15. TEM image of chemically synthesized nanoparticles used as a precursor in the composites.

FIG. 15 shows a TEM image of chemically synthesized nanoparticles (nAg1) used as a precursor in the composites. A solution of nanoparticles sample was sonicated for a minute in acetone and then one drop of the solution was dried on a copper grid coated with amorphous carbon. The microscope used was an Hitachi 8100.

Conductivity of Silver Lines

Tests were performed that demonstrated that the silver lines were electrically conductive. In one test, probes from a volt-ohm meter were contacted to a written pad of silver and impedance of ~80 MΩ was measured over a distance of 200 mm. Since good electrical contact was not assured, this gives an upper limit on the impedance of this length of the line.

Exchange Reaction on nAg7 with Thiol Functionalized Dyes, General Procedure:

The silver nanoparticles were dissolved in $CH_2Cl_2$ and stirred for two hour to ensure complete dissolution. The dye was added and the flask covered with aluminum foil. After stirring for 4 days the solvent was removed in vacuum with the moderate heating to a maximum of 35° C. Acetone was added and the precipitated nanoparticles collected on quantitative filter paper and washed with acetone until the solvent showed no sign of fluorescence in ultraviolet light. The nanoparticles were dried in air and analyzed by elemental analysis.

Example 26

$1_{11}$ Functionalized Nanoparticles (nAg12):

Octylthiol/dodecylthiol protected silver nanoparticles (nAg7) (250 mg), 4-((E)-2-{4-[(E)-2-(4-formylphenyl)ethenyl]-2-[(11-mercaptoundecyl)oxy]-5-methoxyphenyl}ethenyl)benzaldehyde ($1_{11}$) (14.1 mg, 0.025 mmol), $CH_2Cl_2$ (500 ml). Anal. (%) for nAg12 (duplicated analysis): C, 11.78 (11.70); H, 2.07 (2.01); S, 2.76 (2.86); Ag, 76.62 (76.13).

Example 27

$1_{10}$ Functionalized Nanoparticles (nAg11):

Octylthiol/dodecylthiol protected silver nanoparticles (nAg7) (150 mg), 11-(2,5-bis{(E)-2-[4-(diethylamino)phenyl]ethenyl}-4-methoxyphenoxy)undecan-1-thiol ($1_{10}$) (50 mg, 0.076 mmol), $CH_2Cl_2$ (300 ml). Isolated yield: 80.5 mg. Anal. (%) for nAg11 (duplicated analysis): C, 19.41 (19.45); H, 2.85 (2.76); N, 0.62 (0.62); S, 3.06 (3.24); Ag, 71.10 (71.06).

Example 28

$1_9$ functionalized nanoparticles (nAg10):

Octylthiol/dodecylthiol protected silver nanoparticles (nAg7) (150 mg), 11-{4-methoxy-2,5-bis[(E)-2-(4-nitrophenyl)ethenyl]phenoxy}-1-undecanethiol ($1_9$) (46 mg, 0.076 mmol), $CH_2Cl_2$ (300 ml). Anal. (%) for nAg10 (duplicated analysis): C, 20.38 (20.40); H, 2.41 (2.26); N, 0.99 (0.96); S, 2.98 (2.86); Ag, 63.92 (63.97).

Example 29

$1_9$-Only Functionalized Nanoparticles (nAg13):

116.5 mg of silver nitrate were dissolved in ~75 ml ethanol at 0° C. 138 mg of $1_9$ were dissolved in a mixture of ~100 ml acetone and '5 ml of dichloromethane. The dye solution was added to the silver nitrate solution and allowed to stir for 45 minutes. 75 ml of a saturated sodium borohydride solution in ethanol were added dropwise over a four hours period. The solution was allowed to stir for an additional three hours. The solution was stored in a refrigerator overnight and allowed to decant. The precipitate was filtered and washed with water, acetone, and dichloromethane. 146.3 mg of a black powder were collected. Anal. (%) for nAg13: C, 41.00; H, 4.10%; N, 2.88%; S, 3.57%; Ag, 37.51%.

Composition and Preparation of Films of Nanoparticles

Example 30

F14 Film of Dye Attached Nanoparticles Class (i), 20 nm Thick 1 mg of nAg12 was dissolved in 20 cc of chloroform and left to stir for 2 days. 2 mg of $AgBF_4$ were dissolved in 10 cc of acetonitrile; 0.1 cc of this solution were added to the nanoparticle solution. 0.5 cc of the combined solution was cast on a 25×25 mm ITO coated glass slides.

Example 31

F15 Film of Dye Attached Nanoparticles Class (ii), 20 nm Thick 1 mg of nAg12 was dissolved in 20 cc of chloroform and left to stir for 2 days. The film was prepared casting 0.5 cc of the solution on a 25×25 mm ITO coated glass slides.

Example 32

F16 Film of Dye Attached Nanoparticles Class (iii), 20 nm Thick 1 mg of nAg7 was dissolved in 20 cc of chloroform and left to stir for 2 days. 2 mg of $AgBF_4$ were dissolved in 10 cc of acetonitrile; 0.1 cc of this solution were added to the nanoparticle solution. 0.5 cc of the combined solution was cast on a 25×25 mm ITO coated glass slides.

Example 33

F17 Film of Dye Attached Nanoparticles Class (iv), 20 nm Thick 1 mg of nAg7 was dissolved in 20 cc of chloroform and left to stir for 2 days. The film was prepared casting 0.5 cc of the solution on a 25×25 nm ITO coated glass slides.

Example 34

F18 Film of Dye Attached Nanoparticles Class (i), Sub-monolayer 1 mg of nAg12 was dissolved in 20 cc of chloroform and left to stir for 2 days. 2 mg of $AgBF_4$ were dissolved in 10 cc of acetonitrile; 0.1 cc of this solution were added to the nanoparticle solution. 2 cc of the combined solution were diluted 10 times with chloroform, and 2 µl were deposited on a $Si_3N_4$ coated Si substrate (1 $mm^2$).

Example 35

F19 Film of Dye Attached Nanoparticles Class (ii), Sub-monolayer 1 mg of nAg12 was dissolved in 20 cc of chloroform and left to stir for 2 days. 2 cc of the solution were diluted 10 times with chloroform, and 2 µl were deposited on a $Si_3N_4$ coated Si substrate (1 $mm^2$).

Example 36

F20 Film of Dye Attached Nanoparticles Class (iii), Sub-monolayer 1 mg of nAg7 was dissolved in 20 cc of chloroform and left to stir for 2 days. 2 mg of $AgBF_4$ were dissolved in 10 cc of acetonitrile; 0.1 cc of this solution were added to the nanoparticle solution. 2 cc of the combined solution were diluted 10 times with chloroform, and 2 µl were deposited on a $Si_3N_4$ coated Si substrate (1 $mm^2$).

Example 37

F21 Film of Dye Attached Nanoparticles Class (iv), Sub-monolayer 1 mg of nAg7 was dissolved in 20 cc of chloroform and left to stir for 2 days. 2 cc of the solution were diluted 10 times with chloroform, and 2 µl were deposited on a $Si_3N_4$ coated Si substrate (1 $mm^2$).

Example 38

F22 Polymer Based Film for Nanoparticle Growth 1 mg of nAg12 was dissolved in 20 cc of chloroform and left to stir for 2 days. 200.6 mg of PVK and 89 mg of ethylcarbazole were dissolved in 2 cc of the nanoparticle solution and left to stir for 1 day. 210 mg of $AgBF_4$ were dissolved in 1 cc of acetonitrile; 0.1 cc of this solution were added to the nanoparticle/polymer solution. The whole solution was cast on a 25×75 mm glass slide.

Example 39

F23 Film for Reflectivity 271 mg of PCUEMA, 20.5 mg of ethylcarbazole, 1.67 mg of nAg6, and 7.16 mg of 1d were dissolved in 6 cc of chloroform and left to stir overnight. 27 mg of $AgBF_4$ were dissolved in 0.2 cc of acetonitrile and added to the solution. The combined solution was filtered using a 1 µm pores filter and 2 cc of the filtered solution were cast on a 25×75 mm glass slide.

Example 40

F24 Film for Conductivity 2 mg of nAg6 were dissolved in 5 cc of chloroform and left to stir for 1 day. The solution was filtered with a 1 mm pores filter. 21 mg of PVK, 9 mg of ethylcarbazole, and 1.3 mg of 1d were dissolved in 0.3 cc of the nanoparticles solution and left to stir for 2 hours. 20 mg of $AgBF_4$ were dissolved in 0.5 cc of acetonitrile, 0.05 cc of this solution were added to the polymer nanoparticle solution. The solution was cast of half of a tailor made glass slide (25×25 mm), while the other half was covered with Teflon tape.

The slide had on it a pattern of 40 parallel silver lines 150 µm wide, 15 mm long and 50 nm height. The lines were spaced of 32 µm, and were fabricated using standard e beam lithography techniques

Example 41

F25 Copper Microfabrication Film

The film was formed by dissolving 66 mg of poly(methylmethacrylate) PMMA, 1.1 mg of ligand coated copper nanoparticles nCuI, 5 mg of $CuP(CH_3)_3I$, and 3 mg of dye 1d in 0.6 ml of degassed $CHCl_3$ and cast on a 25×25 mm glass slide under an argon atmosphere.

Example 42

F26 Gold Microfabrication Film

The film was formed by dissolving 66 mg of PMMA, 1.1 mg of ligand coated gold nanoparticles nAu1, 5 mg of AuP($CH_3$)$_3$Br, and 3 mg of dye 1d in 0.6 ml of $CHCl_3$ and cast on a 25×25 mm glass slide under an argon atmosphere.

Example 43

F27 Film for Holography 271 mg of PVK, 20.5 mg of ethylcarbazole, 1.67 mg of nAg6, and 0.8 mg of 1d were dissolved in 6 cc of chloroform and left to stir overnight. 27 mg of $AgBF_4$ were dissolved in 0.2 cc of acetonitrile and added to the solution. The combined solution was filtered using a 1 μm pores filter and 2 cc of the filtered solution were cast on a 25×75 mm glass slide.

Provisional U.S. patent application 60/256,148, filed Dec. 15, 2000, and the patents and literature references cited in the Detailed Description, are incorporated herein by reference.

Obviously, numerous modifications and variations on the present invention are possible in light of the above teachings. It is therefore to be understood that within the scope of the appended claims, the invention may be practiced otherwise than as specifically described herein.

What is claimed is:

1. A metal nanoparticle containing composition, comprising:
    a dye, wherein the dye comprises a metal or an ion that absorbs photons with wavelengths ranging from 300 nm to 1.5 μm;
    a metal salt;
    at least one of a sacrificial donor and a matrix, and
    a mixture of two or more ligand coated metal nanoparticles included with the dye, the metal salt, and said at least one of a sacrificial donor and a matrix, with at least two of the two or more ligand coated metal nanoparticles comprising a first ligand coated metal nanoparticle coated with a first ligand set and a second ligand coated metal nanoparticle coated a second ligand set, the first ligand set and the second ligand set comprising different chemical moieties,
    wherein each of the first ligand set and the second ligand set comprises at least one organic ligand represented by the formula A-B-C,
    wherein A comprises a molecular or an ionic fragment for attachment to metal nanoparticle surface, B comprises an organic fragment that has two points of attachment, and C comprises a molecular fragment with one point of attachment to the organic fragment.

2. The composition according to claim 1, wherein said dye is capable of reducing a metal ion from said metal salt under exposure to radiation.

3. The composition according to claim 1, wherein each of said at least two ligand coated metal nanoparticles is selected from the group consisting of a nanoparticle of an alloy of metals, and a metallic nanoshell nanoparticle.

4. The composition according to claim 3, wherein a core of said metallic nanoshell nanoparticle is selected from the group consisting of a semiconductor nanoparticle, a metal oxide nanoparticle, a silicate nanoparticle, a polymer nanoparticle and a protein nanoparticle; and
    wherein an outer shell of said metallic nanoshell is metallic and coated with an organic ligand coating.

5. The composition according to claim 1, wherein each of said at least two of the ligand coated metal nanoparticles is stabilized by the at least one organic ligand.

6. The composition according to claim 1, wherein A is a molecular or ionic fragment that has at least one atom having a lone pair of electrons that can bond to a metal nanoparticle surface, or is an unsaturated molecular or ionic fragment that can bond to the metal nanoparticle surface, and includes a point of attachment to connect the fragment to B.

7. The composition according to claim 1, wherein A and C are each independently selected from the group consisting of $^\ominus$S—, $^\ominus$O—, $^\ominus$O$_2$C—, $^\ominus$S—S—R, $^\ominus$O$_3$S—, O$^\ominus$S$_2$C—NR—, $^\ominus$O$_2$C—NR—, P(R$_1$R$_2$)—, N(R$_1$R$_2$)—, O(R$_1$)—, P(OR$_1$)(OR$_2$)O—, and S$_2$(R)—;
    wherein R, R$_1$, and R$_2$ may be independently selected from the group consisting of —H, a linear or branched alkyl chain containing 1 to 50 carbon atoms, a phenyl group, an aryl group other than a phenyl group, and a hetero aromatic group;
    wherein each of A and C independently has one point of attachment to B.

8. The composition according to claim 1, wherein said two points of attachment comprise one for connecting to part A and one for connecting to part C.

9. The composition according to claim 1, wherein B and C are each independently selected from the group consisting of a methylene chain with 1 to 50 carbon atoms, a phenylene chain with 1 to 20 phenyls, a thiophenylene chain with 1 to 20 thiophenylenes, a phenylene vinylene chain with 1 to 20 phenyl vinylenes, a branched hydrocarbon chain, an ethylene oxide chain with 1 to 20 ethylene oxides, an oligo(vinyl carbazole) chain with 1 to 20 vinyl carbazole units.

10. The composition according to claim 1, wherein C is selected from the group consisting of —H, an aryl group, N-carbazoyl, α-fluorenyl, —SiOR$_3$, —SiCl$_3$, a donor-acceptor dye, a photoreducing dye, another dye, a multi-photon absorbing chromophore, methylene blue, an oligonucleotide strand, and a peptide chain.

11. The composition according to claim 1, wherein C is selected from the group consisting of a carbazole, a bis-styrylbenzene, a cyanine and a thiophene.

12. The composition according to claim 1, wherein said ligand A-B-C is selected from the group consisting of octanethiol, dodecanthiol, heptanethiol, 8-(9H-carbazol-9-yl)octane-1-thiol, 8-(9H-carbazol-9-yl)dodecane-1-thiol, 3-mercaptopropi onic acid, bis[2-(dimethylamino)ethyl]2-mercaptopentadioate, 3 {2,5-bis[(E)-2-(4-formyl-(phenyl)ethenyl]phenoxy}propyl-4-(1,2-dithiolane-3-yl)butanoate and a mixture thereof.

13. The composition according to claim 1, wherein said dye is attached to said two or more ligand coated metal nanoparticles.

14. The composition according to claim 1, wherein said dye is selected from the group consisting of a centrosymmetric bisaldehyde-bistyrylbenzene, a non-centrosymmetric bis-aldehyde-bistyrylbenzene, a centrosymmetric acceptor terminated bistyrylbenzene, a noncentrosymmetric acceptor terminated bistyrylbenzene and a mixture thereof.

15. The composition according to claim 1,
    comprising said matrix.

16. The composition according to claim 14, wherein said matrix is selected from the group consisting of a polymer, a glass, a liquid crystalline material, a liquid and a porous crystalline solid.

17. The composition according to claim 14, wherein said matrix is a polymer selected from the group consisting of polyvinylcarbazole, poly(2-{[11-(9H-carbazole-9-yl)undecanoyl]oxy}ethyl-2-methacrylate), poly(p-chlorostyrene), poly(methylmethacrylate) and a mixture thereof.

18. The composition according to claim 14, wherein said matrix is 1-[11-(9H-carbazole-9-yl)]-4-methoxybenzene, 1-[11-(9H-carbazole-9-yl)]-4-methylbenzene or a mixture thereof.

19. The composition according to claim 14, further comprising a plasticizer.

20. The composition according to claim 18, wherein said plasticizer is N-ethylcarbazole, p,p'-formyl-N-octyl-carbazole or a mixture thereof.

21. The composition according to claim 14, wherein said dye is capable of reducing a metal ion from said metal salt under exposure to radiation.

22. The composition according to claim 14, wherein each of said at least two ligand coated metal nanoparticles is selected from the group consisting of a metal nanoparticle, a nanoparticle of an alloy of metals, and a metallic nanoshell nanoparticle.

23. The composition according to claim 14, wherein a core of said metallic nanoshell nanoparticle is selected from the group consisting of a semiconductor nanoparticle, a metal oxide nanoparticle, a silicate nanoparticle, a polymer nanoparticle and a protein nanoparticle; and
wherein an outer shell of said metallic nanoshell is metallic and coated with an organic coating.

24. The composition according to claim 14, wherein each of said at least two ligand coated metal nanoparticles is stabilized by the at least one organic ligand.

25. The composition according to claim 14, wherein A is a molecular or ionic fragment that has at least one atom having a lone pair of electrons that can bond to a metal nanoparticle surface, or is an unsaturated molecular or ionic fragment that can bond to the metal nanoparticle surface, and includes a point of attachment to connect the fragment to B.

26. The composition according to claim 14, wherein A and C are each independently selected from the group consisting of $^\ominus$S—, $^\ominus$O—, $^\ominus$O$_2$C—, $^\ominus$S—S—R, $^\ominus$O$_3$S—, $^\ominus$S$_2$C—NR—, $^\ominus$O$_2$C—NR—, P(R$_1$, R$_2$)—, N(R$_1$R$_2$)—, O(R$_1$)—, P(OR$_1$)(OR$_2$)O—, and S$_2$(R)—;
wherein R, R$_1$, and R$_2$ may be independently selected from the group consisting of —H, a linear or branched alkyl chain containing 1 to 50 carbon atoms, a phenyl group, an aryl group other than a phenyl group, and a hetero aromatic group;
wherein each of A and C independently has one point of attachment to B.

27. The composition according to claim 14, wherein said two points of attachment comprise one for connecting to part A and one for connecting to part C.

28. The composition according to claim 14, wherein B and C are each independently selected from the group consisting of a methylene chain with 1 to 50 carbon atoms, a phenylene chain with 1 to 20 phenyls, a thiophenylene chain with 1 to 20 thiophenylenes, a phenylene vinylene chain with 1 to 20 phenyl vinylenes, a branched hydrocarbon chain, an ethylene oxide chain with 1 to 20 ethylene oxides, an oligo(vinyl carbazole) chain with 1 to 20 vinyl carbazole units.

29. The composition according to claim 14, wherein C is selected from the group consisting of —H, an aryl group, N-carbazoyl, α-fluorenyl, —SiOR$_3$, —SiCl$_3$3, a dye, a donor-acceptor dye, a photoreducing dye, a multi-photon absorbing chromophore, methylene blue, an oligonucleotide strand, a peptide chain.

30. The composition according to claim 14, wherein C is selected from the group consisting of a carbazole, a bis-styrylbenzene, a cyanine and a thiophene.

31. The composition according to claim 14, wherein said ligand A-B-C is selected from the group consisting of octanethiol, dodecanthiol, heptanethiol, 8-(9H-carbazol-9-yl)octane-I-thiol, 8-(9H-carbazol-9-yl)dodecane-1-thiol, 3-mercaptopropionic acid, Bis[2(dimethylamino)ethyl]2-mercaptopentadioate, 3 {2,5-bis[(E)-2-(4-formyl-(pheny) ethenyl]phenoxy}propyl-4-(1,2-dithiolane-3-yl)butanoate and a mixture thereof.

32. The composition according to claim 14, wherein said dye is attached to said two or more ligand coated metal nanoparticles.

33. The composition according to claim 14, wherein said dye is selected from the group consisting of a centrosymmetric bisaldehyde-bistyrylbenzene, a non-centrosymmetric bisaldehyde-bistyrylbenzene, a centrosymmetric acceptor terminated bistyrylbenzene, a noncentrosymmetnc acceptor terminated bistyrylbenzene and a mixture thereof.

34. The composition according to claim 1, wherein the first ligand coated metal nanoparticle and the second ligand coated metal nanoparticle comprise silver, gold, or copper.

* * * * *